(12) United States Patent
Shin et al.

(10) Patent No.: US 12,074,141 B2
(45) Date of Patent: Aug. 27, 2024

(54) SEMICONDUCTOR PACKAGE

(71) Applicant: Samsung Electronics Co., Ltd., Suwon-si (KR)

(72) Inventors: Seung Hun Shin, Cheonan-si (KR); Un Byoung Kang, Hwaseong-si (KR); Yeong Kwon Ko, Hwaseong-si (KR); Jong Ho Lee, Hwaseong-si (KR); Teak Hoon Lee, Hwaseong-si (KR); Jun Yeong Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 186 days.

(21) Appl. No.: 17/531,115

(22) Filed: Nov. 19, 2021

(65) Prior Publication Data
US 2022/0293565 A1    Sep. 15, 2022

(30) Foreign Application Priority Data

Mar. 10, 2021    (KR) .................. 10-2021-0031127

(51) Int. Cl.
| | | |
|---|---|---|
| *H01L 23/498* | (2006.01) | |
| *H01L 23/31* | (2006.01) | |
| *H01L 23/48* | (2006.01) | |
| *H01L 25/065* | (2023.01) | |

(52) U.S. Cl.
CPC ...... *H01L 25/0657* (2013.01); *H01L 23/3142* (2013.01); *H01L 23/481* (2013.01); *H01L 23/49838* (2013.01); *H01L 2225/06513* (2013.01); *H01L 2225/06517* (2013.01)

(58) Field of Classification Search
CPC ........... H01L 23/49838; H01L 25/0657; H01L 23/481
See application file for complete search history.

(56) References Cited

U.S. PATENT DOCUMENTS

| | | |
|---|---|---|
| 8,703,508 B2 | 4/2014 | Chang et al. |
| 9,620,430 B2 | 4/2017 | Lu et al. |
| 9,935,000 B2 | 4/2018 | Mathew et al. |
| 9,966,278 B1 | 5/2018 | Kim et al. |

(Continued)

FOREIGN PATENT DOCUMENTS

KR    101783711 B1    10/2017

*Primary Examiner* — Dale E Page
*Assistant Examiner* — Wilner Jean Baptiste
(74) *Attorney, Agent, or Firm* — Muir Patent Law, PLLC

(57) ABSTRACT

There is provided a semiconductor device comprising a first semiconductor chip which includes a first chip substrate, and a first through via penetrating the first chip substrate, a second semiconductor chip disposed on the first semiconductor chip, and includes a second chip substrate, and a second through via penetrating the second chip substrate, and a connecting terminal disposed between the first semiconductor chip and the second semiconductor chip to electrically connect the first through via and the second through via. The semiconductor device further comprising an interchip molding material which includes a filling portion that fills between the first semiconductor chip and the second semiconductor chip and encloses the connecting terminal, an extension portion that extends along at least a part of a side surface of the second semiconductor chip, and a protruding portion protruding from the extension portion.

13 Claims, 17 Drawing Sheets

(56) References Cited

U.S. PATENT DOCUMENTS

| | | | |
|---|---|---|---|
| 10,181,460 B2 | 1/2019 | Asahi et al. | |
| 10,431,547 B2 * | 10/2019 | Nam | H01L 25/0657 |
| 10,504,824 B1 | 12/2019 | Pan et al. | |
| 11,948,903 B2 * | 4/2024 | Park | H01L 23/481 |
| 2012/0088332 A1 * | 4/2012 | Lee | H01L 21/561 |
| | | | 257/E21.499 |
| 2014/0295620 A1 | 10/2014 | Ito et al. | |
| 2018/0286835 A1 | 10/2018 | Nah | |

* cited by examiner

SEMICONDUCTOR PACKAGE

This application claims priority under 35 U.S.C. § 119 from Korean Patent Application No. 10-2021-0031127 filed on Mar. 10, 2021, in the Korean Intellectual Property Office, the disclosure of which is incorporated in its entirety by reference herein.

BACKGROUND

1. Field of the Invention

The present disclosure relates to a semiconductor package.

2. Description of the Related Art

With the rapid development of electronics industry and demand of users, electronic devices are increasingly becoming smaller and lighter. Semiconductor packages used in the electronic devices are required to have high performance and large capacity together with miniaturization and low weight.

In order to realize high performance and large capacity together with miniaturization and low weight, research and development of a semiconductor chip including a through via (TSV) structure and a semiconductor package including the same are continuously performed.

SUMMARY

Aspects of the present disclosure provide a semiconductor package having improved product reliability.

However, aspects of the present disclosure are not restricted to the one set forth herein. The above and other aspects of the present disclosure will become more apparent to one of ordinary skill in the art to which the present disclosure pertains by referencing the detailed description of the present invention given below.

According to an aspect of the present disclosure, there is provided a semiconductor device comprising a first semiconductor chip which includes a first chip substrate, and a first through via penetrating the first chip substrate; a second semiconductor chip which is disposed on the first semiconductor chip, and includes a second chip substrate, and a second through via penetrating the second chip substrate; a connecting terminal which is disposed between the first semiconductor chip and the second semiconductor chip to electrically connect the first through via and the second through via; and an inter-chip molding material which includes a filling portion that fills between the first semiconductor chip and the second semiconductor chip and encloses the connecting terminal, an extension portion that extends along at least a part of a side surface of the second semiconductor chip, and a protruding portion protruding from the extension portion.

According to an aspect of the present disclosure, there is provided a first semiconductor chip which includes a first side wall and a second side wall extending in a first direction and opposite to each other in a second direction, and a third side wall and a fourth side wall extending in the second direction and opposite to each other in the first direction; a second semiconductor chip which is disposed on the first semiconductor chip, and includes a fifth side wall and a sixth side wall extending in the first direction and opposite to each other in the second direction, and a seventh side wall and an eighth side wall extending in the second direction and opposite to each other in the first direction; a connecting terminal which is disposed between the first semiconductor chip and the second semiconductor chip to electrically connect the first semiconductor chip and the second semiconductor chip; and an inter-chip molding material which encloses the connecting terminal, fills between the first semiconductor chip and the second semiconductor chip, and includes a first portion extending along at least a part of the fifth side wall, a second portion extending along at least a part of the sixth side wall, a third portion extending along at least a part of the seventh side wall, and a fourth portion extending along at least a part of the eighth side wall, wherein at least a part of an upper surface of the first semiconductor chip between the side walls of the first to fourth portions and the fifth to eighth side walls includes irregularities.

According to an aspect of the present disclosure, there is provided a semiconductor package comprising: a first semiconductor chip which includes a first chip substrate, and a first through via penetrating the first chip substrate; a first connecting terminal which is disposed on a lower surface of the first semiconductor chip and electrically connected to the first through via; a second semiconductor chip which is disposed on the first semiconductor chip, and includes a second chip substrate, and a second through via which penetrates at least a part of the second chip substrate; a second connecting terminal which is disposed between the first semiconductor chip and the second semiconductor chip to electrically connect the first through via and the second through via; a first-chip inter-chip molding material which includes a first filling portion that fills between the first semiconductor chip and the second semiconductor chip and encloses the second connecting terminal, a first extension portion extending along at least a part of a side surface of the second semiconductor chip, and a first protruding portion that protrudes from the first extension portion and is not disposed between the first semiconductor chip and the second semiconductor chip; and a package molding material that covers the upper surface of the first semiconductor chip, the side surface of the second semiconductor chip, and the inter-chip molding material, on the first semiconductor chip, wherein the upper surface of the first semiconductor chip includes a first portion that is in contact with the first inter-chip molding material and flat, and a second portion that is in contact with the package molding material and includes irregularities, and at least a part of a side wall of the first extension portion is flat.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Figure 1:
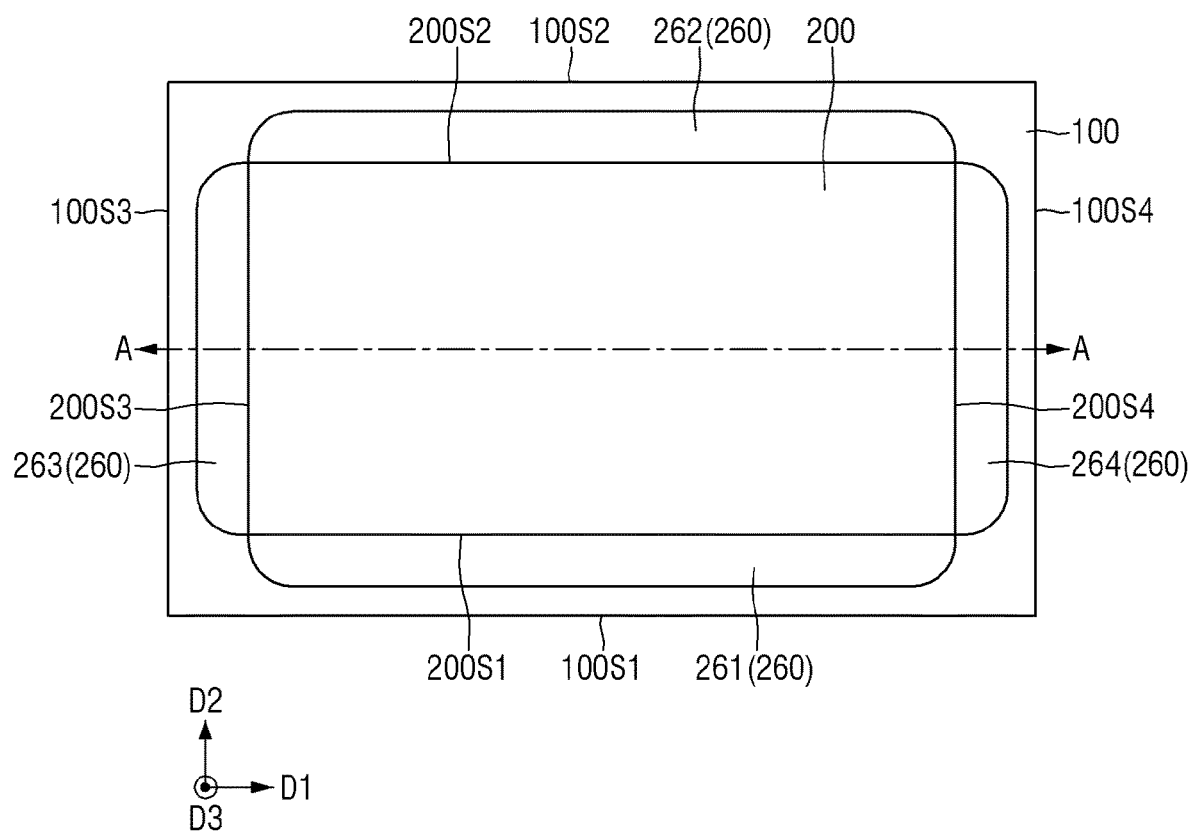
FIG. 1 is a plan view illustrating a semiconductor package according to an example embodiment of the inventive concepts.
Figure 2:
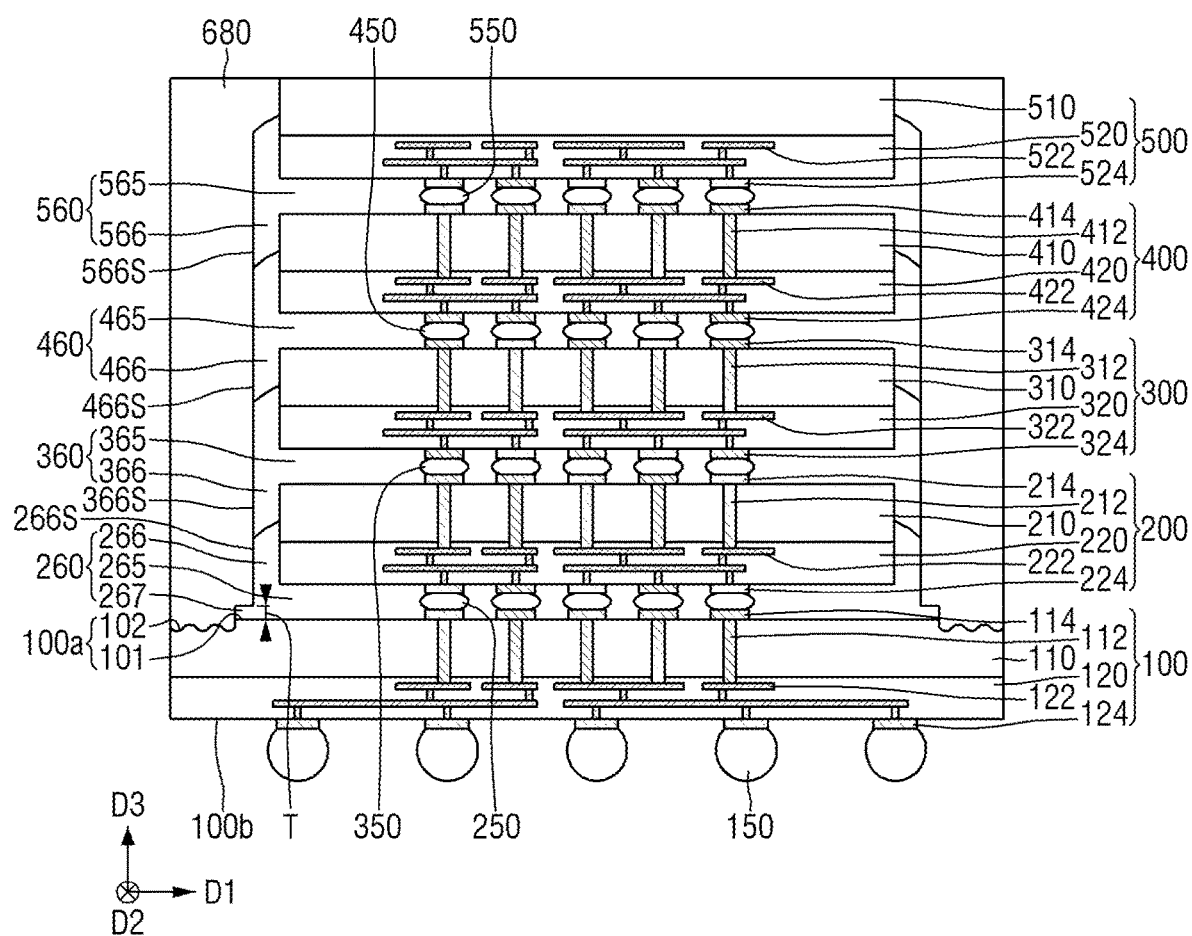
FIG. 2 is a cross-sectional view taken along a line A-A of FIG. 1.

FIG. 1 is a plan view illustrating a semiconductor package according to an example embodiment of the inventive concepts. FIG. 2 is a cross-sectional view taken along a line A-A of FIG. 1.

For reference, FIG. 1 is a diagram showing a first semiconductor chip 100, a second semiconductor chip 200, and a first inter-chip molding material 260 in FIG. 2.

Referring to FIGS. 1 and 2, the package according to some embodiments may include the first semiconductor chip 100, the second semiconductor chip 200, a third semiconductor chip 300, a fourth semiconductor chip 400, and a fifth semiconductor chip 500.

For example, the first semiconductor chip 100 may be a buffer chip, and the second to fifth semiconductor chips 200, 300, 400, and 500 may be memory semiconductor chips. The memory semiconductor chip may be, for example, a volatile memory semiconductor chip such as a DRAM (Dynamic Random Access Memory) or a SRAM (Static Random Access Memory), or may be a non-volatile memory semiconductor chip such as a PRAM (Phase-change Random Access Memory), a MRAM (Magnetoresistive Random Access Memory), a FeRAM (Ferroelectric Random Access Memory) or a RRAM (Resistive Random Access Memory).

In another example, the first semiconductor chip 100 may be a buffer chip, the second semiconductor chip 200 may be a logic semiconductor chip, and the third to fifth semiconductor chips 300, 400 and 500 may be memory semiconductor chips. The logic semiconductor chip may be, for example, a central processing unit (CPU), a controller, an application specific integrated circuit (ASIC) or the like.

Although FIG. 2 shows that five semiconductor chips are stacked in the semiconductor package, this is only for convenience of explanation, and the embodiment is not limited thereto.

The first semiconductor chip 100 may include an upper surface 100a and a lower surface 100b that are opposite to each other with respect to a third direction D3. The upper surface 100a of the first semiconductor chip 100 and the lower surface 100b of the first semiconductor chip 100 may extend in a first direction D1 and a second direction D2. The upper surface 100a of the first semiconductor chip 100 may be defined by a first chip substrate 110, and the lower surface 100b of the first semiconductor chip 100 may be defined by a first semiconductor element layer 120.

The first semiconductor chip 100 may include the first chip substrate 110, a first through via 112, a first upper connecting pad 114, the first semiconductor element layer 120, a first wiring layer 122, and a first lower connecting pad 124.

The first through via 112 may be placed inside the first chip substrate 110. The first through via 112 may penetrate the first chip substrate 110. The shape of the first through via 112 may change depending on the fabricating process. For example, in a direction in which the first through via 112 extends from the upper surface 100a to the lower surface 100b, the first through via 112 may have a tapered shape.

The first upper connecting pad 114 may be placed on the upper surface 100a of the first semiconductor chip 100. The first upper connecting pad 114 may be placed on the upper surface of the first semiconductor element layer 120. The first upper connecting pad 114 may be electrically connected to the first through via 112.

The first semiconductor element layer 120 may be placed on the lower surface of the first chip substrate 110. The first semiconductor element layer 120 may include a first wiring layer 122. The first wiring layer 122 may include a plurality of conductive wirings or conductive plugs. The first wiring layer 122 may be electrically connected to the first through via 112.

Although not shown, on the upper surface 100a of the first semiconductor chip 100, an upper passivation layer which surrounds at least a part of the side surface of the first through via 112 on the first chip substrate 110 may be further formed.

The first lower connecting pad 124 may be placed on the lower surface 100b of the first semiconductor chip 100. For example, the first lower connecting pad 124 may be placed on the lower surface of the first semiconductor element layer 120. The first lower connecting pad 124 may be electrically connected to the first wiring layer 122. The first lower connecting pad 124 may be electrically connected to the first through via 112 through the first wiring layer 122.

Although not shown, a lower passivation layer for protecting the first wiring layer 122 in the first semiconductor element layer 120 and other structures may be further formed on the lower surface of the first semiconductor element layer 120. The lower passivation layer may expose at least a part of the lower surface of the first lower connecting pad 124.

The first connecting terminal 150 may be placed on the first lower connecting pad 124. The first connecting terminal 150 may be electrically connected to the first lower connecting pad 124.

The first connecting terminal 150 may include, for example, a solder layer having a spherical or ball shape. The first connecting terminal 150 may include or may be formed of, for example, tin (Sn), indium (In), bismuth (Bi), antimony (Sb), copper (Cu), silver (Ag), zinc (Zn), lead (Pb), and/or alloys thereof.

The first connecting terminal 150 may further include a pillar structure. The pillar structure may include or may be formed of, for example, nickel (Ni), nickel alloys, copper (Cu), copper alloys, palladium (Pd), platinum (Pt), gold (Au), cobalt (Co), and combinations thereof. The first connecting terminal 150 may further include a lower metal layer placed between the pillar structure and the first lower connecting pad 124. The lower metal layer may be a seed layer, an adhesive layer or a barrier layer for forming the pillar structure. For example, the lower metal layer may include or may be formed of chromium (Cr), tungsten (W), titanium (Ti), copper (Cu), nickel (Ni), aluminum (Al), palladium (Pd), gold (Au) or a combination thereof. The lower metal layer may be a single metal layer, but may also be a stacked structure including a plurality of metal layers.

The first inter-chip molding material 260 may be placed between the first semiconductor chip 100 and the second semiconductor chip 200, such that, in the third direction D3, the second semiconductor chip 200 overlaps a portion of the inter-chip molding material 260 and the inter-chip molding material 260 overlaps at least a portion of the first semiconductor chip 100. For example, the second semiconductor chip 200 may vertically overlap a portion of the inter-chip molding material 260 and the inter-chip molding material 260 may vertically overlap at least a portion of the first semiconductor chip 100. The first inter-chip molding material 260 may be placed on the upper surface 100a of the first semiconductor chip 100. The first inter-chip molding material 260 may be in contact with a first region 101 of the upper surface 100a of the first semiconductor chip 100. When an element is referred to as "contacting" or "in contact with" another element or as being "directly connected" or "directly coupled" to another element, there are no intervening elements present at the point of contact. In contrast, when an element is referred to as being "connected" or "coupled" to or "on" another element, it can be directly connected or coupled to or on the other element or intervening elements may be present.

The first inter-chip molding material 260 may include a first filling portion 265, a first extension portion 266, and a first protruding portion 267.

The first filling portion 265 may fill between the first semiconductor chip 100 and the second semiconductor chip 200, such that, in the third direction D3, the second semiconductor chip 200 overlaps the first filling portion 265, and the first filling portion 265 overlaps the first semiconductor chip 100. For example, the second semiconductor chip 200 may vertically overlap the first filling portion 265, and the first filling portion 265 may vertically overlap the first semiconductor chip 100. The first filling portion 265 may enclose a second connecting terminal 250.

The first extension portion 266 may be placed on the upper surface 100a of the first semiconductor chip 100. The first extension portion 266 may extend along at least a part of the side surface of the second semiconductor chip 200. The first extension portion 266 may extend, for example, in the third direction D3. A side wall 266S of the first extension portion may be flat (e.g., planar). It will be appreciated that "flat," "planar," "planarization," "co-planar," etc., as used herein refer to structures (e.g., surfaces) that need not be perfectly geometrically planar, but may include acceptable variances that may result from standard manufacturing processes.

The first protruding portion 267 may not be placed between the first semiconductor chip 100 and the second semiconductor chip 200, such that, in the third direction D3, the second semiconductor chip 200 does not overlap the first protruding portion 267. For example, the second semiconductor chip 200 may not vertically overlap the first protruding portion 267. The first protruding portion 267 may overlap, in the third direction D3, the first semiconductor chip 100. For example, the first protruding portion 267 may vertically overlap the first semiconductor chip 100. The first protruding portion 267 may protrude from the first extension portion 266. The first protruding portion 267 may protrude from the first extension portion 266 toward side walls 100S2 and 100S4 of the first semiconductor chip 100 opposite to the first extension portion 266.

The first protruding portion 267 may be placed on the upper surface 100a of the first semiconductor chip 100. The first protruding portion 267 may be in contact with the upper surface 100a of the first semiconductor chip 100. The first protruding portion 267 may extend along the upper surface 100a of the first semiconductor chip 100. A thickness T, measured in the third direction D3, of the first protruding portion 267 on the first region 101 of the upper surface 100a of the first semiconductor chip 100 may, for example, have a value between 0 μm and 10 μm.

The second semiconductor chip 200 may be placed on the first semiconductor chip 100. The second semiconductor chip 200 may be placed on the upper surface 100a of the first semiconductor chip 100. The second semiconductor chip 200 may be electrically connected to the first semiconductor chip 100.

The second semiconductor chip 200 may include a second chip substrate 210, a second through via 212, a second upper connecting pad 214, a second semiconductor element layer 220, a second wiring layer 222, and a second lower connecting pad 224.

The second through via 212 may be placed inside the second chip substrate 210. The second through via 212 may penetrate the second chip substrate 210.

The second upper connecting pad 214 may be placed on the upper surface of the second semiconductor chip 200. For example, the second upper connecting pad 214 may be placed on the upper surface of the second semiconductor element layer 220. The second upper connecting pad 214 may be electrically connected to the second through via 212.

The second semiconductor element layer 220 may be placed on the lower surface of the second chip substrate 210. The second semiconductor element layer 220 may include a second wiring layer 222. The second wiring layer 222 may include a plurality of conductive wirings or conductive plugs. The second wiring layer 222 may be electrically connected to the second through via 212.

The second lower connecting pad 224 may be placed on the lower surface of the second semiconductor chip 200. For example, the second lower connecting pad 224 may be placed on the lower surface of the second semiconductor element layer 220. The second lower connecting pad 224 may be electrically connected to the second wiring layer 222. The second lower connecting pad 224 may be electrically connected to the second through via 212 through the second wiring layer 222.

The second connecting terminal 250 may be placed between the first semiconductor chip 100 and the second semiconductor chip 200. For example, the second connecting terminal 250 may be placed on the second lower connecting pad 224 and the first upper connecting pad 114. The second connecting terminal 250 may be electrically connected to the second lower connecting pad 224 and the first upper connecting pad 114. As a result, the second connecting terminal 250 may electrically connect the first semiconductor chip 100 and the second semiconductor chip 200.

The second connecting terminal 250 may differ in size, shape or structure from the first connecting terminal 150. For example, the second connecting terminal 250 may be smaller in size than the first connecting terminal 150. The second connecting terminal 250 may include, for example, a solder layer having a spherical or ball shape. The second connecting terminal 250 may include or may be formed of, for example, tin (Sn), indium (In), bismuth (Bi), antimony (Sb), copper (Cu), silver (Ag), zinc (Zn), lead (Pb) and/or alloys thereof.

The second connecting terminal 250 may further include a pillar structure. The pillar structure may include or may be formed of, for example, nickel (Ni), nickel alloys, copper (Cu), copper alloys, palladium (Pd), platinum (Pt), gold (Au), cobalt (Co) and combinations thereof. Although not illustrated, the second connecting terminal 250 may further include a lower metal layer placed between the pillar structure and the second lower connecting pad 224. The lower metal layer may be a seed layer, an adhesive layer or a barrier layer for forming the pillar structure. For example, the lower metal layer may include or may be formed of chromium (Cr), tungsten (W), titanium (Ti), copper (Cu), nickel (Ni), aluminum (Al), palladium (Pd), gold (Au) or a combination thereof. The lower metal layer may be a single metal layer, but may also be a stacked structure including a plurality of metal layers.

A second inter-chip molding material 360 may be placed between the second semiconductor chip 200 and the third semiconductor chip 300. The second inter-chip molding material 360 may include a second filling portion 365 and a second extension portion 366.

The second filling portion 365 may fill between the second semiconductor chip 200 and the third semiconductor chip 300, such that, in the third direction D3, the third semiconductor chip 300 overlaps the second filling portion 365, and the second filling portion 365 overlaps the second semiconductor chip 200. For example, the third semiconductor chip 300 may vertically overlap the second filling portion 365, and the second filling portion 365 may vertically overlap the second semiconductor chip 200. The second filling portion 365 may enclose a third connecting terminal 350.

The second extension portion 366 may be placed on the first inter-chip molding material 260. For example, the second extension portion 366 may be placed on the first extension portion 266. The second extension portion 366 may be in contact with the first extension portion 266.

The second extension portion 366 may extend along at least a part of the side surface of the second semiconductor chip 200 and at least a part of the side surface of the third semiconductor chip 300. The second extension portion 366 may extend, for example, in the third direction D3. A side wall 366S of the second extension portion may be flat (e.g., planar).

The third semiconductor chip 300 may be placed on the second semiconductor chip 200. The third semiconductor chip 300 may be placed on the upper surface of the second semiconductor chip 200. The third semiconductor chip 300 may be electrically connected to the second semiconductor chip 200.

The third semiconductor chip 300 may include a third chip substrate 310, a third through via 312, a third upper connecting pad 314, a third semiconductor element layer 320, a third wiring layer 322, and a third lower connecting pad 324.

The third through via 312 may be placed inside the third chip substrate 310. The third through via 312 may penetrate the third chip substrate 310.

The third upper connecting pad 314 may be placed on the upper surface of the third semiconductor chip 300. For example, the third upper connecting pad 314 may be placed on the upper surface of the third semiconductor element layer 320. The third upper connecting pad 314 may be electrically connected to the third through via 312.

The third semiconductor element layer 320 may be placed on the lower surface of the third chip substrate 310. The third semiconductor element layer 320 may include a third wiring layer 322. The third wiring layer 322 may include a plurality of conductive wirings or conductive plugs. The third wiring layer 322 may be electrically connected to the third through via 312.

The third lower connecting pad 324 may be placed on the lower surface of the third semiconductor chip 300. For example, the third lower connecting pad 324 may be placed on the lower surface of the third semiconductor element layer 320. The third lower connecting pad 324 may be electrically connected to the third wiring layer 322. The third lower connecting pad 324 may be electrically connected to the third through via 232 through the third wiring layer 322.

The third connecting terminal 350 may be placed between the second semiconductor chip 200 and the third semiconductor chip 300. For example, the third connecting terminal 350 may be placed on the third lower connecting pad 324 and the second upper connecting pad 214. The third connecting terminal 350 may be electrically connected to the third lower connecting pad 324 and the second upper connecting pad 214. Accordingly, the third connecting terminal 350 may electrically connect the second semiconductor chip 200 and the third semiconductor chip 300. The third connecting terminal 350 may have the same structure as the second connecting terminal 250.

A third inter-chip molding material 460 may be placed between the third semiconductor chip 300 and the fourth semiconductor chip 400. The third inter-chip molding material 460 may include a third filling portion 465 and a third extension portion 466.

The third filling portion 465 may fill between the third semiconductor chip 300 and the fourth semiconductor chip 400, such that, in the third direction D3, the fourth semiconductor chip 400 overlaps the third filling portion 465, and the third filling portion 465 overlaps the third semiconductor chip 300. For example, the fourth semiconductor chip 400 may vertically overlap the third filling portion 465, and the third filling portion 465 may vertically overlap the third semiconductor chip 300. The third filling portion 465 may enclose the fourth connecting terminal 450.

The third extension portion 466 may be placed on the second inter-chip molding material 360. For example, the third extension portion 466 may be placed on the second extension portion 366. The third extension portion 466 may be in contact with the second extension portion 366.

The third extension portion 466 may extend along at least a part of the side surface of the third semiconductor chip 300 and at least a part of the side surface of the fourth semiconductor chip 400. The third extension portion 466 may extend, for example, in the third direction D3. A side wall 466S of the third extension portion may be flat (e.g., planar).

The fourth semiconductor chip 400 may be placed on the third semiconductor chip 300. The fourth semiconductor chip 400 may be placed on the upper surface of the third semiconductor chip 300. The fourth semiconductor chip 400 may be electrically connected to the third semiconductor chip 300.

The fourth semiconductor chip 400 may include a fourth chip substrate 410, a fourth through via 412, a fourth upper connecting pad 414, a fourth semiconductor element layer 420, a fourth wiring layer 422, and a fourth lower connecting pad 424.

The fourth through via 412 may be placed inside the fourth chip substrate 410. The fourth through via 412 may penetrate the fourth chip substrate 410.

The fourth upper connecting pad 414 may be placed on the upper surface of the fourth semiconductor chip. For example, the fourth upper connecting pad 414 may be placed on the upper surface of the fourth semiconductor element layer 420. The fourth upper connecting pad 414 may be electrically connected to the fourth through via 412.

The fourth semiconductor element layer 420 may be placed on the lower surface of the fourth chip substrate 410. The fourth semiconductor element layer 420 may include a fourth wiring layer 422. The fourth wiring layer 422 may include a plurality of conductive wirings or conductive plugs. The fourth wiring layer 422 may be electrically connected to the fourth through via 412.

The fourth lower connecting pad 424 may be placed on the lower surface of the fourth semiconductor chip 400. For example, the fourth lower connecting pad 424 may be placed on the lower surface of the fourth semiconductor element layer 420. The fourth lower connecting pad 424 may be electrically connected to the fourth wiring layer 422. The fourth lower connecting pad 424 may be electrically connected to the fourth through via 412 through the fourth wiring layer 422.

The fourth connecting terminal 450 may be placed between the third semiconductor chip 300 and the fourth semiconductor chip 400. The fourth connecting terminal 450 may be placed on the fourth lower connecting pad 424 and the third upper connecting pad 314. The fourth connecting terminal 450 may be electrically connected to the fourth lower connecting pad 424 and the third upper connecting pad 314. Accordingly, the fourth connecting terminal 450 may electrically connect the third semiconductor chip 300 and the fourth semiconductor chip 400. The fourth connecting terminal 450 may have the same structure as that of the third connecting terminal 350.

A fourth inter-chip molding material 560 may be placed between the fourth semiconductor chip 400 and the fifth semiconductor chip 500. The fourth inter-chip molding material 560 may include a fourth filling portion 565 and a fourth extension portion 566.

The fourth filling portion 565 may fill between the fourth semiconductor chip 400 and the fifth semiconductor chip 500, such that, in the third direction D3, the fifth semiconductor chip 500 overlaps the fourth filling portion 565, and the fourth filling portion 565 overlaps the fourth semiconductor chip 400. For example, the fifth semiconductor chip 500 may vertically overlap the fourth filling portion 565, and the fourth filling portion 565 may vertically overlap the fourth semiconductor chip 400. The fourth filling portion 565 may enclose a fifth connecting terminal 550.

The fourth extension portion 566 may be placed on the third inter-chip molding material 460. The fourth extension portion 566 may be placed on the third extension portion 466. The fourth extension portion 566 may be in contact with the third extension portion 466.

The fourth extension portion 566 may extend along at least a part of the third semiconductor chip 300 and at least a part of the side surface of the fourth semiconductor chip 400. The fourth extension portion 566 may extend, for example, in the third direction D3. At least a part of the side wall 566S of the fourth extension portion may be flat (e.g., planar). For example, the lower portion of the side wall 566S of the fourth extension portion may be flat, and the upper portion may be convex in the third direction D3. The lower portion of the side wall 566S of the fourth extension portion may be placed on substantially the same plane as the side walls 266S, 366S and 466S of the first to third extension portions. This may be caused by the fabricating process of cutting the first to fourth inter-chip molding materials 260, 360, 460 and 560. For example, the first to fourth inter-chip molding materials 260, 360, 460 and 560 may be cut by a physical method which uses a blade. Further, the thickness T of the first protruding portion 267 may be determined on the first region 101 of the upper surface 100a of the first semiconductor chip 100, depending on the position at which the first to fourth inter-chip molding materials 260, 360, 460 and 560 are cut by the blade.

The fifth semiconductor chip 500 may be placed on the fourth semiconductor chip 400. The fifth semiconductor chip 500 may be placed on the upper surface of the fourth semiconductor chip 400. The fifth semiconductor chip 500 may be electrically connected to the fourth semiconductor chip 400.

The fifth semiconductor chip 500 may include a fifth chip substrate 510, a fifth semiconductor element layer 520, a fifth wiring layer 522, and a fifth lower connecting pad 524.

Although FIG. 2 shows that the fifth chip substrate 510 does not include a through via, the embodiment is not limited thereto. The fifth chip substrate 510 may include a through via that penetrates at least a part of the fifth chip substrate 510. The through via may also be exposed on the upper surface of the fifth chip substrate 510.

The fifth semiconductor element layer 520 may be placed on the lower surface of the fifth chip substrate 510. The fifth semiconductor element layer 520 may include a fifth wiring layer 522. The fifth wiring layer 522 may include a plurality of conductive wirings or conductive plugs.

The fifth lower connecting pad 524 may be placed on the lower surface of the fifth semiconductor chip 500. For example, the fifth lower connecting pad 524 may be placed on the lower surface of the fifth semiconductor element layer 520. The fifth lower connecting pad 524 may be electrically connected to the fifth wiring layer 522.

The fifth connecting terminal 550 may be placed between the fourth semiconductor chip 400 and the fifth semiconductor chip 500. The fifth connecting terminal 550 may be placed on the fifth lower connecting pad 524 and the fourth upper connecting pad 414. The fifth connecting terminal 550 may be electrically connected to the fifth lower connecting pad 524 and the fourth upper connecting pad 414. Accordingly, the fifth connecting terminal 550 may electrically connect the fourth semiconductor chip 400 and the fifth semiconductor chip 500. The fifth connecting terminal 550 may have the same structure as that of the fourth connecting terminal 450.

The first to fifth chip substrates 110, 210, 310, 410 and 510 may be bulk silicon or SOI (silicon-on-insulator). In contrast, the first to fifth chip substrates 110, 210, 310, 410 and 510 may be silicon substrates, or may include or may be formed of, but are not limited to, other substances such as silicon germanium, SGOI (silicon germanium on insulator), indium antimonide, lead tellurium compounds, indium arsenic, indium phosphide, gallium arsenide or gallium antimonide.

The first to fourth through vias 112, 212, 312 and 412 may include conductive material. The first to fourth through vias 112, 212, 312 and 412 may include or may be formed of, for example, at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), rhenium (Ru), tantalum (Ta), tellurium (Te), titanium (Ti), tungsten (W), zinc (Zn) and zirconium (Zr). However, the technical idea of the present disclosure is not limited thereto.

The first to fourth upper connecting pads 114, 214, 314 and 414 may include or may be formed of, for example, at least one of aluminum (Al), copper (Cu), nickel (Ni), tungsten (W), platinum (Pt), and gold (Au).

The first to fifth lower connecting pads 124, 224, 324, 424 and 524 may include or may be formed of, for example, at least one of aluminum (Al), copper (Cu), nickel (Ni), tungsten (W), platinum (Pt), and gold (Au).

The first to fourth inter-chip molding materials 260, 360, 460 and 560 may include or may be formed of, for example, a non-conductive film (NCF) or a non-conductive paste (NCP). Although FIG. 2 illustrates the delineation of boundaries among the first to fourth inter-chip molding materials 260, 360, 460 and 560, aspects of the disclosure are not limited as such. For example, the boundaries between the first to fourth inter-chip molding materials 260, 360, 460 and 560 may not be distinguishable.

A package molding material 680 may be placed on the first semiconductor chip 100. The package molding material 680 may be placed on the upper surface 100a of the first semiconductor chip 100. The package molding material 680 may be in contact with the first protruding portion 267 on the first region 101 and the second region 102 of the upper surface 100a of the first semiconductor chip 100.

The package molding material 680 may contact and cover the side walls (266S, 366S, 466S, and 566S) of the second to fifth semiconductor chips 200, 300, 400 and 500. The upper surface of the package molding material 680 may not cover the upper surface of the fifth semiconductor chip 500. For example, the upper surface of the package molding material 680 may include the opening through which the upper surface of the fifth semiconductor chip 500 may be exposed. A top surface of the package molding material 680 may be placed on substantially the same plane as the upper surface of the fifth semiconductor chip 500. Although FIG. 2 illustrates the upper surface of the package molding material 680 including the opening through which the upper surface of the fifth semiconductor chip 500 may be exposed aspects of the disclosure are not limited as such. For example, the package molding material 680 may be placed on the upper surface of the fifth semiconductor chip 500.

The package molding material 680 may include or may be formed of, for example, an epoxy molding compound (EMC) or two or more kinds of silicon hybrid substances.

As the thicknesses, measured in the third direction D3, of the first to fourth inter-chip molding materials 260, 360, 460 and 560 are thick on the side walls of the second to fifth semiconductor chips 200, 300, 400 and 500, warpage of the semiconductor package may increase. However, the first to fourth inter-chip molding materials 260, 360, 460 and 560 may have a thickness of a certain thickness or less on the side walls of the second to fifth semiconductor chips 200, 300, 400 and 500 in the semiconductor device according to some embodiments. Warpage of the semiconductor package according to some embodiments may be improved or relieved accordingly.

FIGS. 3 to 8 are diagrams for explaining a semiconductor package according to some embodiments. For convenience of explanation, the points different from those described using FIGS. 1 and 2 will be mainly described. For reference, FIGS. 3 to 8 are cross-sectional views taken along a line A-A of FIG. 1.

Figure 3:
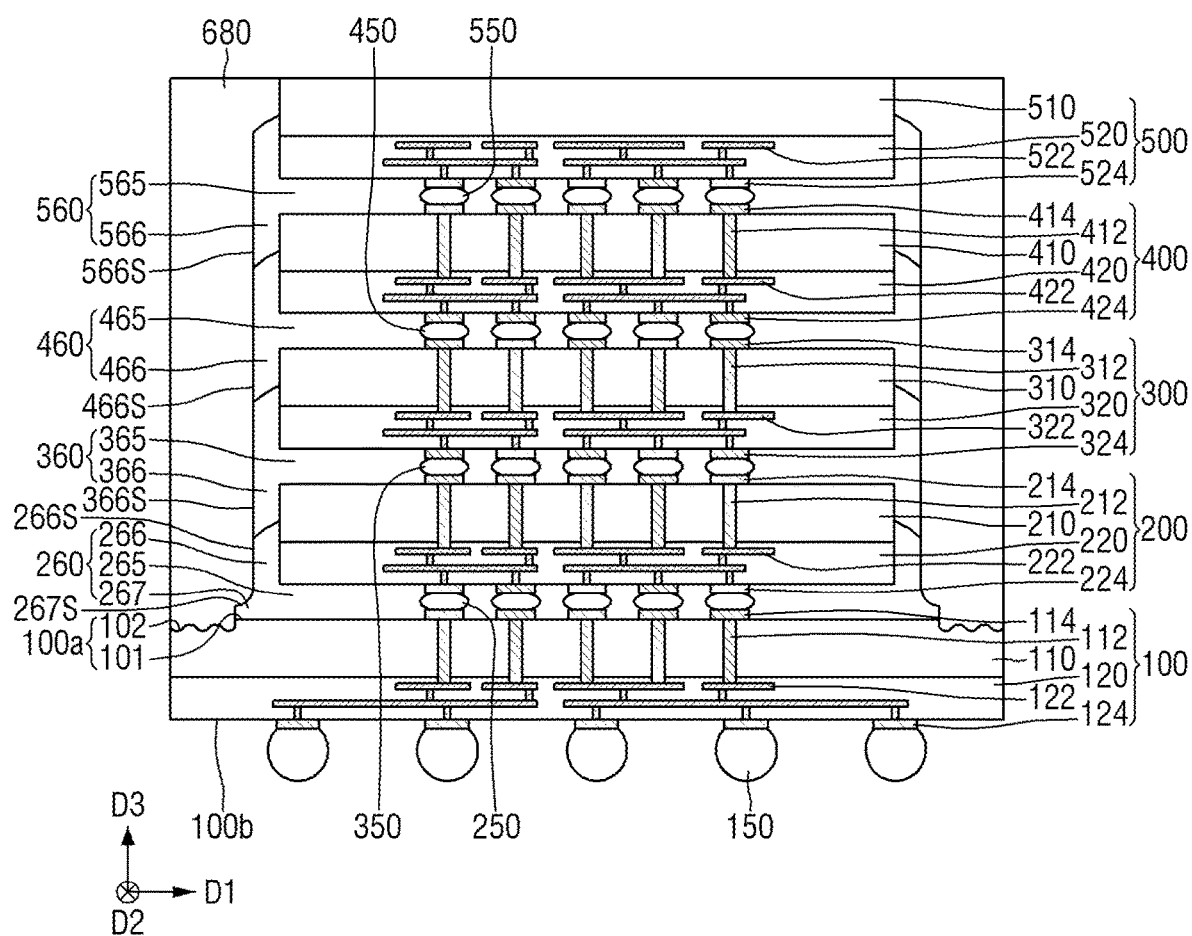
FIGS. 3 to 8 are diagrams illustrating the semiconductor package according to example embodiments of the inventive concepts.

Referring to FIG. 3, in the semiconductor package according to some embodiments, an upper surface 267S of the first protruding portion 267 may have a curved shape. For example, the upper surface 267S of the first protruding portion 267 may be concave toward the first semiconductor chip 100. The upper surface 267S of the first protruding portion may be connected to the side wall 266S of the first extension portion.

Figure 4:
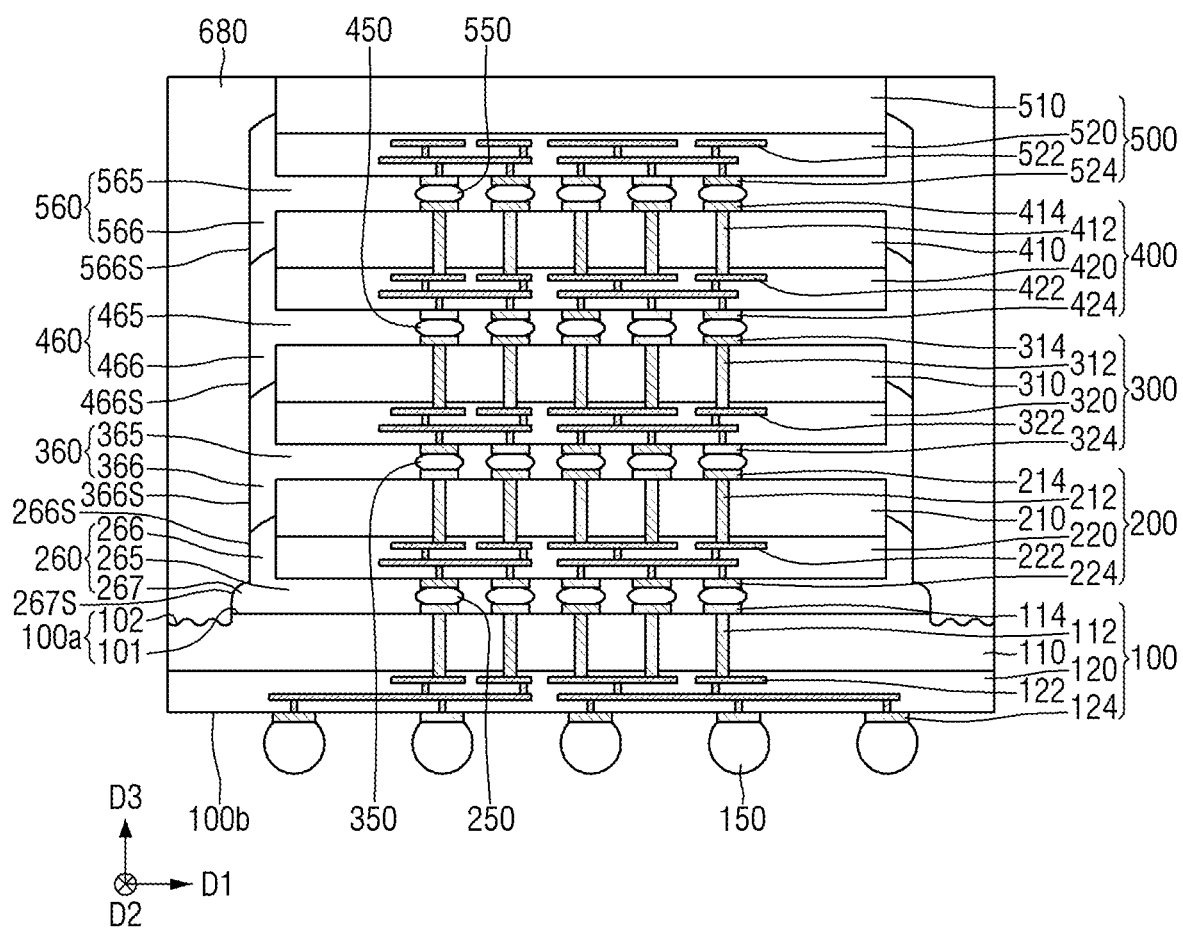

Referring to FIG. 4, in the semiconductor package according to some embodiments, the upper surface 267S of the first protruding portion may be convex toward the first semiconductor chip 100.

Figure 5:
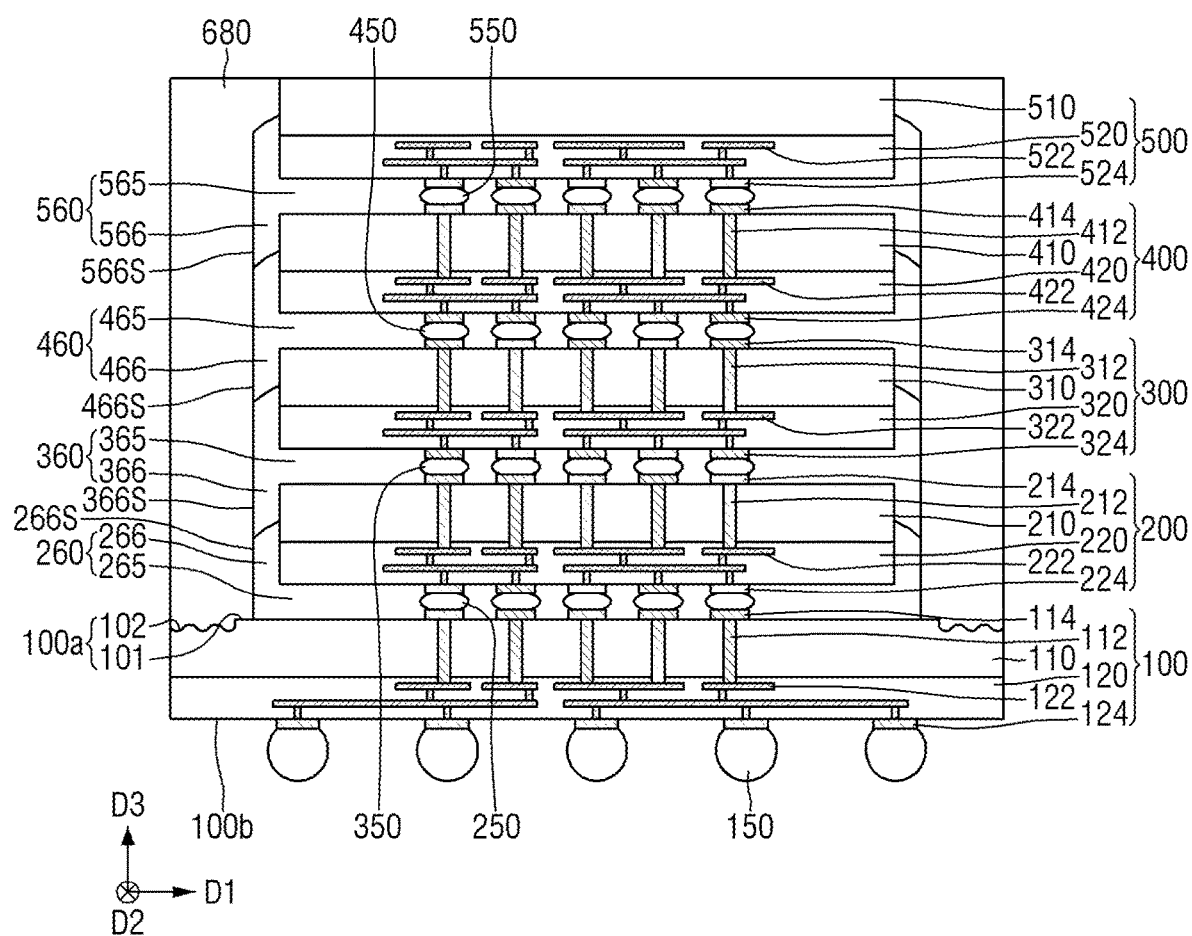

Referring to FIG. 5, in the semiconductor package according to some embodiments, the first inter-chip molding material 260 may include a first filling portion 265 and a first extension portion 266.

The first extension portion 266 may be in contact with the upper surface 100a of the first semiconductor chip 100. The first extension portion 266 may extend from the upper surface 100a of the first semiconductor chip 100 along at least a part of the side surface of the second semiconductor chip 200.

Side walls 266S, 366S, 466S and 566S of the first to fourth extension portions may be flat (e.g., planar). The side walls 266S, 366S, 466S and 566S of the first to fourth extension portions may be placed substantially on the same plane. The side walls 266S, 366S, 466S and 566S of the first to fourth extension portions may be, for example, perpendicular to the upper surface 100a of the first semiconductor chip 100.

At least a part of the package molding material 680 may be in contact with the flat first region 101 of the upper surface 100a of the first semiconductor chip 100, and the remaining part of the package molding material 680 may be in contact with the second region 102 including irregularities of the upper surface 100a of the first semiconductor chip 100. The first inter-chip molding material 260 may be in contact with package molding material 680 and the flat first region 101 of the upper surface 100a of the first semiconductor chip 100.

Referring to FIG. 1, the first semiconductor chip 100 may include first to fourth side walls 100S1, 100S2, 100S3 and 100S4. A first side wall 100S1 and a second side wall 100S2 may extend in the first direction D1, and be opposite to each other in the second direction D2. A third side wall 100S3 and a fourth side wall 100S4 may extend in the second direction D2, and be opposite to each other in the first direction D1.

The second semiconductor chip 200 may include fifth to eighth side walls 200S1, 200S2, 200S3 and 200S4. A fifth side wall 200S1 and a sixth side wall 200S2 may extend in the first direction D1, and be opposite to each other in the second direction D2. A seventh side wall 200S3 and an eighth side wall 200S4 may extend in the second direction D2, and be opposite to each other in the first direction D1.

A cross section of the first and second portions 261 and 262 cut along the second direction D2 may correspond to the first inter-chip molding material 260 of FIG. 2. The first protruding portion 267 protrudes from the first to fourth portions 261, 262, 263 and 264, and may not be placed between the first semiconductor chip 100 and the second semiconductor chip 200. For example, the second semiconductor chip 200 may not vertically overlap the first protruding portion 267. At least one side wall among the side walls of the first to fourth portions 261, 262, 263 and 264 may include a flat portion, that is, the side wall 266S of the first extension portion.

At least a part of the upper surface 100a of the first semiconductor chip 100 between the side walls of the first to fourth portions 261, 262, 263 and 264 and the fifth to eighth side walls 200S1, 200S2, 200S3 and 200S4 may include irregularities. For example, the upper surface 100a of the first semiconductor chip 100 may include a flat first region 101, and a second region 102 including irregularities. The upper surface 100a of the first semiconductor chip 100 between the side walls of the first to fourth portions 261, 262, 263 and 264 and the fifth to eighth side walls 200S1, 200S2, 200S3 and 200S4 may be the second region 102. That is, the first region 101 may be in contact with the first inter-chip molding material 260, and the second region 102 may be in contact with the package molding material 680.

The second region 102 may have an uneven surface. The second region 102 may be placed below the first region 101 with respect to the third direction D3. For example, second region 102 may be placed vertically below the first region such that, there may be a step between the second region 102 and the first region 101. This may be caused by the fabricating process of cutting the first to fourth inter-chip molding materials 260, 360, 460 and 560. For example, since the first to fourth inter-chip molding materials 260, 360, 460 and 560 are cut using a blade, the side walls of the first to fourth extension portions 266, 366, 466 and 566 may be flattened. Subsequently, the portions of the first to fourth inter-chip molding materials 260, 360, 460 and 560 that has not been cut by the blade may be cut using a laser grooving. Therefore, the second region 102 may include the irregularities due to the laser grooving. For example, the second region is uneven, and the first region is even. This may be a tanning trace by the laser beam. Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Figure 6:
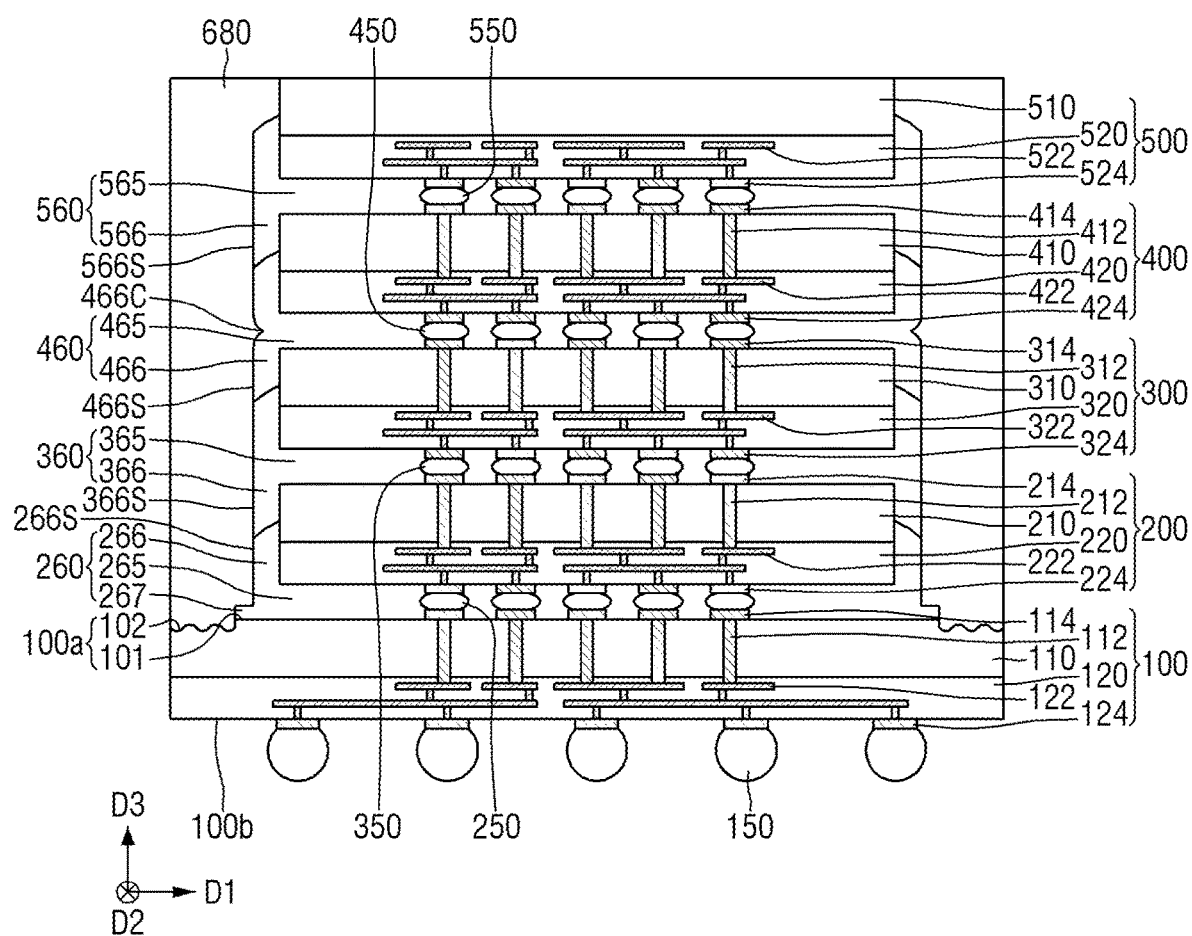

Referring to FIG. 6, in the semiconductor package according to some embodiments, at least one side wall of the side walls 266S, 366S, 466S and 566S of the first to fourth extension portions 266-566 may include a portion 466C that is indented toward the second to fifth semiconductor chips 200, 300, 400 and 500.

For example, as shown in FIG. 6, the side wall 466S of the third extension portion 466 may include a portion 466C that is indented toward the third filling portion 465. Although FIG. 6 illustrates the portion 466C disposed at a vertical level (i.e., in the third direction D3) between the third semiconductor chip 300 and the fourth semiconductor chip 400, aspects of the disclosure are not limited as such. For example, the indented portion 466C may be disposed at a vertical level on the side surface of the third semiconductor chip 300 or at a vertical level on the side surface of the fourth semiconductor chip 400. Further, the indented portion 466C may be formed only on one side of the side wall 466S of the third extension portion 466.

Figure 7:
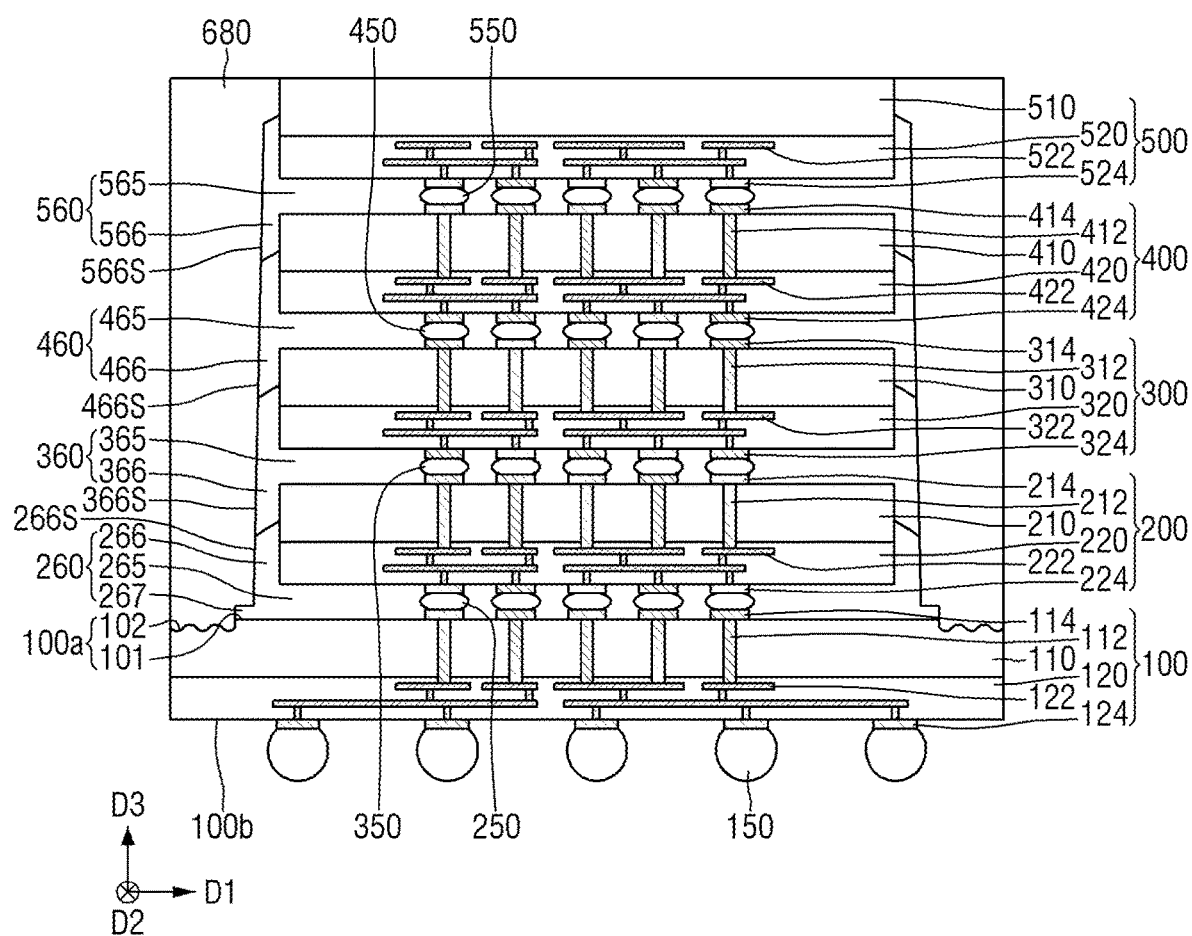

Referring to FIG. 7, the side walls 266S, 366S, 466S and 566S of the first to fourth extension portions may be tapered. For example, the width, with respect to the first direction D1, of the side walls 266S, 366S, 466S and 566S may increase travelling along the third direction D3 from the fifth semiconductor chip 500 to the first semiconductor chip 100.

Figure 8:
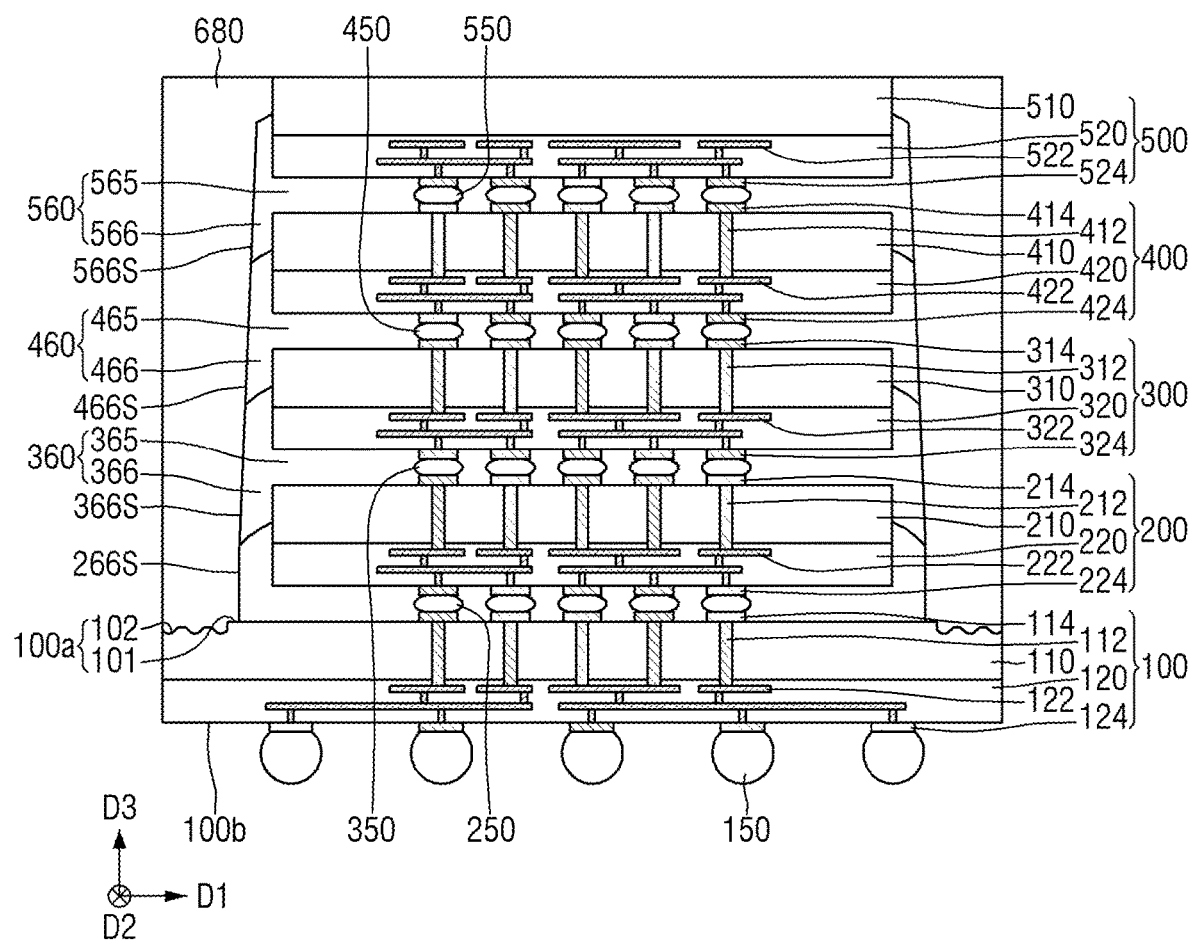

Referring to FIG. 8, in the semiconductor package according to some embodiments, at least some parts of the side walls 266S, 366S, 466S and 566S of the first to fourth extension portions 266-566 may be perpendicular to the upper surface 100a of the first semiconductor chip 100, and the remaining parts may be tapered. The lower portions of the side walls 266S, 366S, 466S and 566S of the first to fourth extension portions 266-566 may be perpendicular to the upper surface 100a of the first semiconductor chip 100, and the upper portions of the side walls 266S, 266S, 366S, 466S and 566S of the first to fourth extension portions may be tapered.

For example, as shown in FIG. 8, the side wall 266S of the first extension portion may be perpendicular to the upper surface 100a of the first semiconductor chip 100. Alternatively, unlike that shown in FIG. 8, the lower portion of the side wall 266S of the first extension may be perpendicular to the upper surface 100a of the first semiconductor chip 100, and the remaining part may be tapered.

Figure 9:
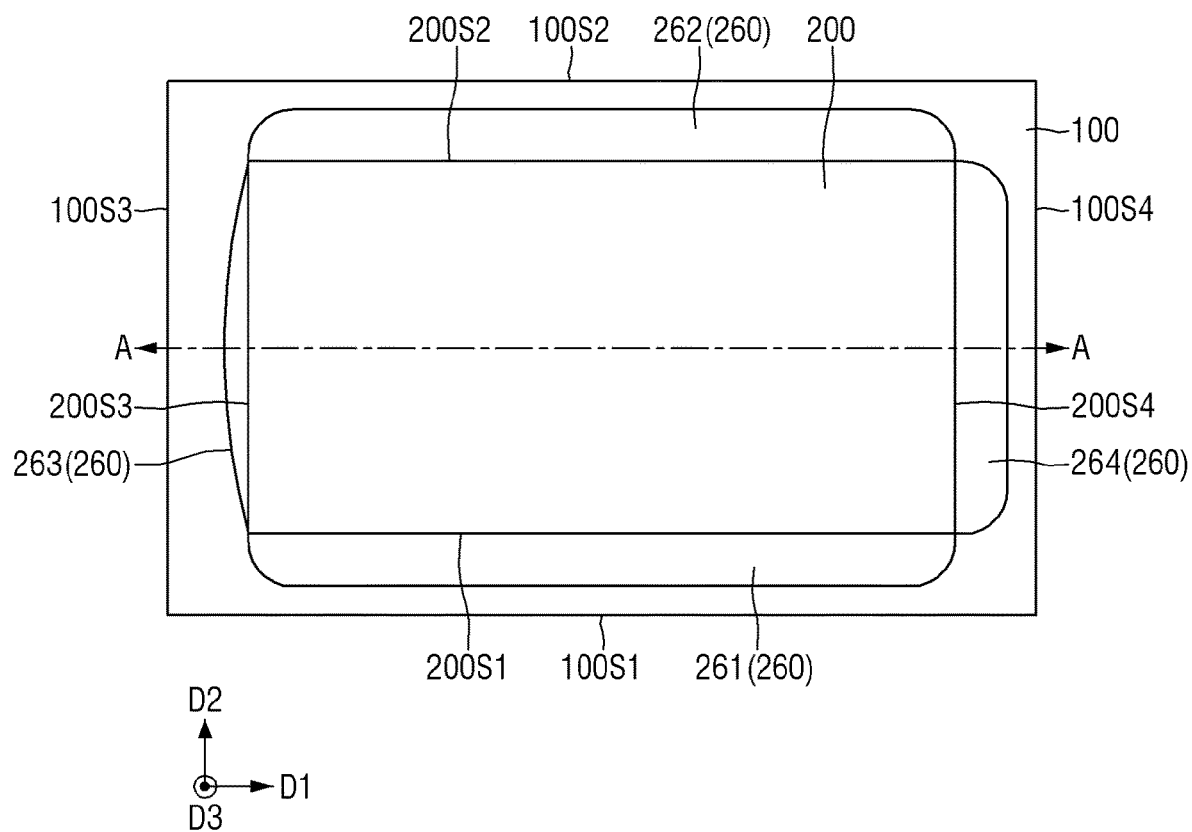
FIG. 9 is a plan view illustrating the semiconductor package according to an example embodiment of the inventive concepts.
Figure 10:
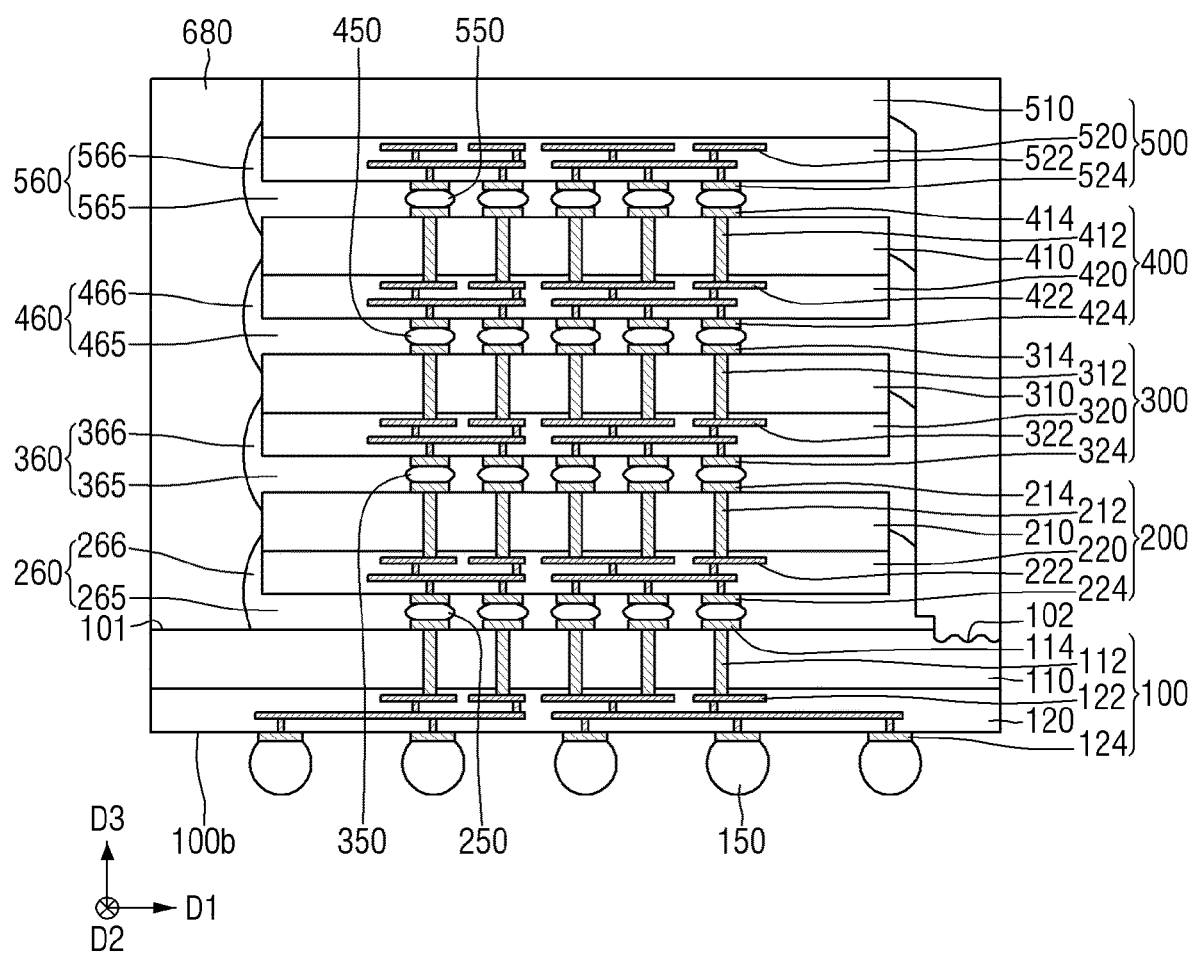
FIG. 10 is a cross-sectional view taken along a line A-A of FIG. 9.

FIG. 9 is a plan view for explaining the semiconductor package according to some embodiments. FIG. 10 is a cross-sectional view taken along a line A-A of FIG. 9. For convenience of explanation, the points different from those described using FIGS. 1 and 2 will be mainly described.

Referring to FIGS. 9 and 10, in the semiconductor package according to some embodiments, a first portion 261 which extends along at least a part of the fifth side wall 200S1 of the second semiconductor chip, a second portion 262 which extends along at least a part of the sixth side wall 200S2 of the semiconductor chip 2, and a fourth portion 264 which extends along at least part of the eighth side wall 200S4 of the second semiconductor chip may correspond to the first portion 261, the second portion 262, and the fourth portion 264 of FIG. 2, respectively. The second to fourth inter-chip molding materials 360, 460 and 560 placed on the first portion 261, the second portion 262 and the fourth portion 264 may correspond to the second to fourth inter-chip molding materials 360, 460 and 560 of FIG. 2, respectively.

Alternatively, unlike that shown in FIG. 10, the first portion 261, the second portion 262, the fourth portion 264, and the second to fourth inter-chip molding materials 360, 460 and 560 placed on the first portion 261, the second portion 262 and the fourth portion 264 may correspond to the first portion 261, the second portion 262, the fourth portion 264, and second to fourth inter-chip materials 360, 460 and 560 placed on the first portion 261, the second portion 262 and the fourth portion 264 of FIGS. 3 to 8, respectively.

A third portion 263 extending along at least a part of the seventh side wall 200S3 of the second semiconductor chip of the first inter-chip molding material 260 may include a first filling portion 265 and a first extension portion 266. The first filling portion 265 may fill between the first semiconductor chip 100 and the second semiconductor chip 200. For example, the second semiconductor chip 200 may vertically overlap the first filling portion 265, and the first filling portion 265 may vertically overlap at least a portion of the first semiconductor chip 100. The first filling portion 265 may enclose the second connecting terminal 250. The first extension portion 266 may extend along at least a part of the side surface of the second semiconductor chip 200 on the upper surface 100a of the first semiconductor chip 100.

The first to fourth inter-chip molding materials 260, 360, 460 and 560 may be selectively removed. When the thicknesses of the first to fourth inter-chip molding materials 260, 360, 460 and 560 are equal to or less than a certain thickness on the side walls of the second to fifth semiconductor chips 200, 300, 400 and 500, the first to fourth inter-chip molding materials may not be removed For example, the first inter-chip molding material 260 of the third portion 263 and the second to fourth inter-chip molding materials 360, 460 and 560 placed on the third portion 263 may not be removed, when their thicknesses are equal to or less than a certain thickness. Therefore, the first inter-chip molding material 260 of the first portion 261, the second portion 262 and the fourth portion 264, and second to fourth inter-chip materials 360, 460 and 560 placed on the first portion 261, the second portion 262 and the fourth portion 264 may be cut, using a blade and a laser, and the first inter-chip molding material 260 of the third portion 263, and the second to fourth inter-chip materials 360, 460 and 560 placed on the third portion 263 may not be cut.

Accordingly, the side walls of the first to fourth extension portions 266, 366, 466 and 566 may not be flat. For example, the side walls of the first to fourth extension portions 266, 366, 466 and 566 may be convex toward the package molding material 680.

The first to fourth extension portions 266, 366, 466 and 566 may not be in contact with each other. The first to fourth extension portions 266, 366, 466 and 566 may be separated from each other in the third direction D3. Alternatively, unlike that shown in FIG. 10, at least some of the first to fourth extension portions 266, 366, 466 and 566 may be in contact with each other.

At least a part of the package molding material 680 and the first inter-chip molding material 260 may be in contact with the flat first region 101 on the upper surface 100a of the first semiconductor chip 100. The remaining part of the package molding material 680 may be in contact with the second region 102 including irregularities of the upper surface 100a of the first semiconductor chip 100. That is, the upper surface 100a of the first semiconductor chip 100 between the side wall of the third portion 263 and the third side wall 100S3 may be a first region 101, and the upper surface 100a of the first semiconductor chip 100 between the side wall of the first portion 261 and the first side wall 100S1, between the side wall of the second portion 262 and the second side wall 100S2, and between the side wall of the fourth portion 264 and the fourth side wall 100S4 may be the second region 102.

Figure 11:
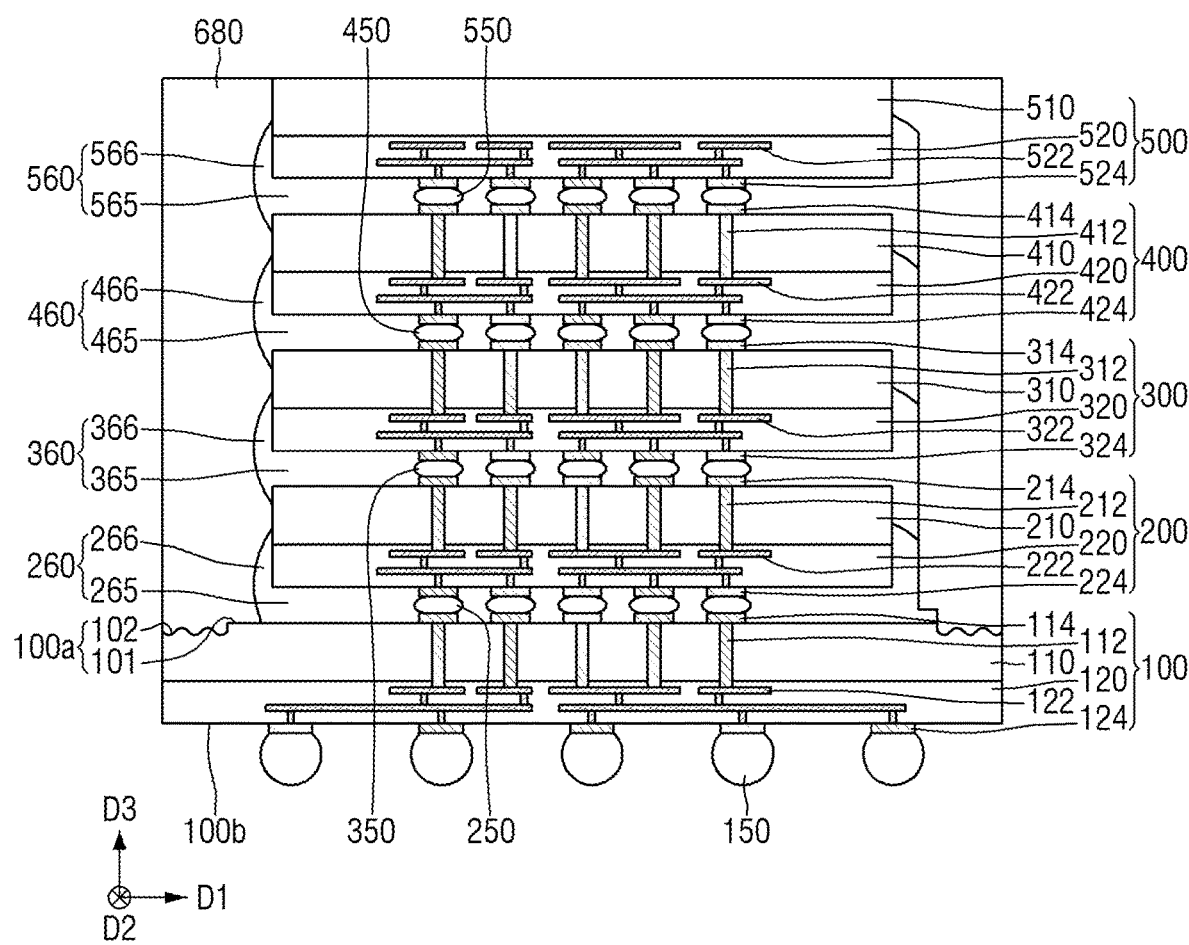
FIG. 11 is a diagram illustrating a semiconductor package according to an example embodiment of the inventive concepts.

FIG. 11 is a diagram for explaining a semiconductor package according to some embodiments. For convenience of explanation, the points different from those described using FIGS. 9 and 10 will be mainly described. For reference, FIG. 11 is a cross-sectional view taken along a line A-A of FIG. 9.

Referring to FIG. 11, in the semiconductor package according to some embodiments, the first inter-chip molding material 260 of the first to fourth portions 261, 262, 263 and 264, and the second to fourth inter-chip molding materials 360, 460 and 560 placed on the first to fourth portions 261, 262, 263 and 264 may be cut, using a blade and a laser. Accordingly, the upper surface 100a of the first semiconductor chip 100 between the side wall of the third portion 263 and the third side wall 100S3 may include the first region 101 and the second region 102.

Unlike that shown in FIG. 11, when the portion in which the first inter-chip molding material 260 of the third portion 263, and the second to fourth inter-chip materials 360, 460 and 560 placed on the first inter-chip molding material 260 of the third portion 263 are convex toward the package molding material 680 has a certain thickness or more, at least a part thereof may be cut by the blade. Accordingly, at least some parts of the side walls of the first inter-chip molding material 260 of the third portion 263, and the second to fourth inter-chip molding materials 360, 460 and 560 placed on the first inter-chip molding material 260 of the third portion 263 may include a flat portion.

FIGS. 12 to 16 are intermediate stage diagrams for explaining a method for fabricating the semiconductor package according to some embodiments.

Figure 12:
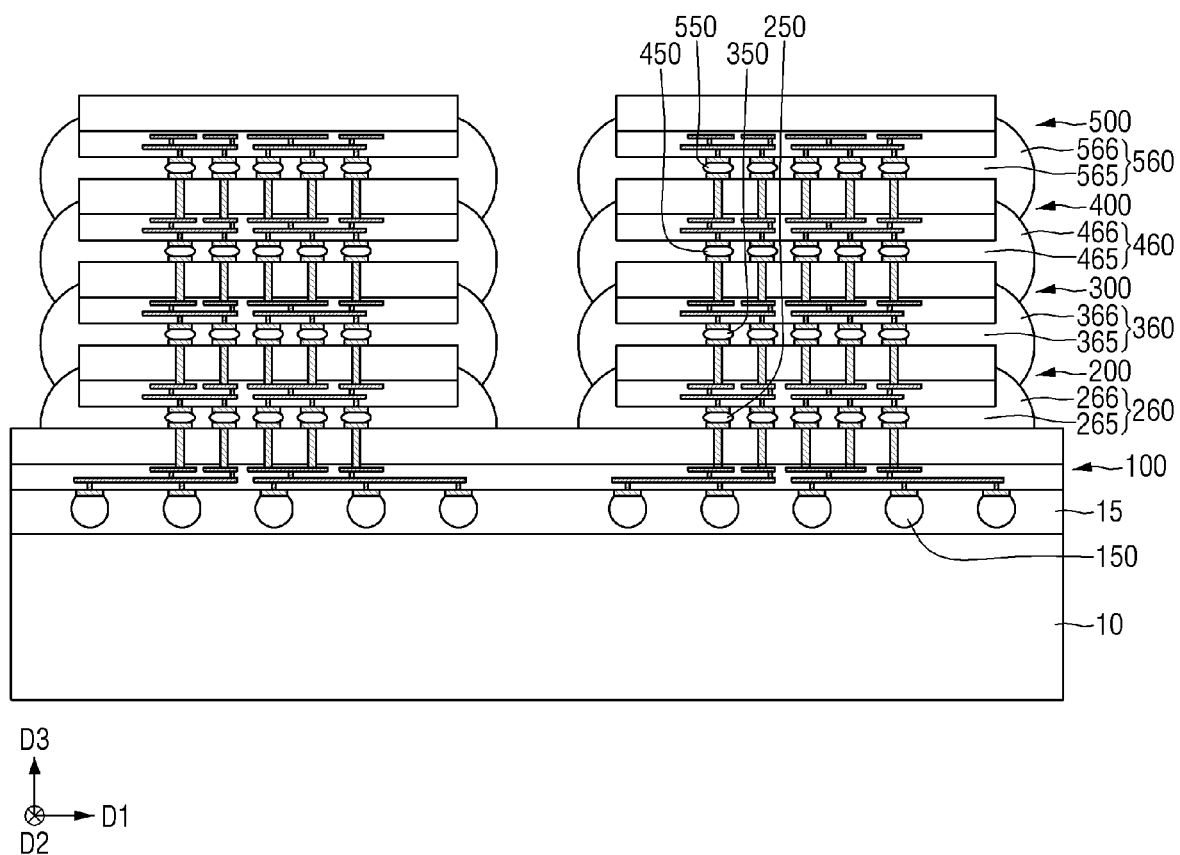
FIGS. 12 to 16 are intermediate stage diagrams illustrating a method for fabricating a semiconductor package according to example embodiments of the inventive concepts.

Referring to FIG. 12, a carrier substrate 10 to which the first semiconductor chip 100 is attached may be provided. The second to fifth semiconductor chips 200, 300, 400 and 500 may be mounted on the first semiconductor chip 100.

For example, referring to FIGS. 2 and 12, a first through via 112 may be formed in the first chip substrate 110. The first semiconductor element layer 120 may be formed on a lower surface of the first chip substrate 110. The first lower connecting pad 124 may be formed on the first semiconductor element layer 120. A first connecting terminal 150 may be formed on the first lower connecting pad 124. The first semiconductor chip 100 may be attached onto the carrier substrate 10. The first semiconductor chip 100 may be attached onto the carrier substrate 10 by an adhesive material layer 15. A part of the first chip substrate 110 may be removed to expose the first through via 112. A first upper connecting pad 114 may be formed on the first through via 112.

A second semiconductor chip 200 may be mounted on the first upper connecting pad 114. The second semiconductor chip 200 may be electrically connected to the first upper connecting pad 114 by the second connecting terminal 250. A first inter-chip molding material 260, which includes a first filling portion 265 that encloses the second connecting terminal 250, and a first extension portion 266 that extends along at least a part of the side surfaces of the second semiconductor chip 200, may be formed on the first semiconductor chip 100.

Subsequently, the third to fifth semiconductor chips 300, 400 and 500 may be sequentially mounted on the second semiconductor chip 200. The second to fourth inter-chip molding materials 360, 460 and 560 may be formed.

Figure 13:
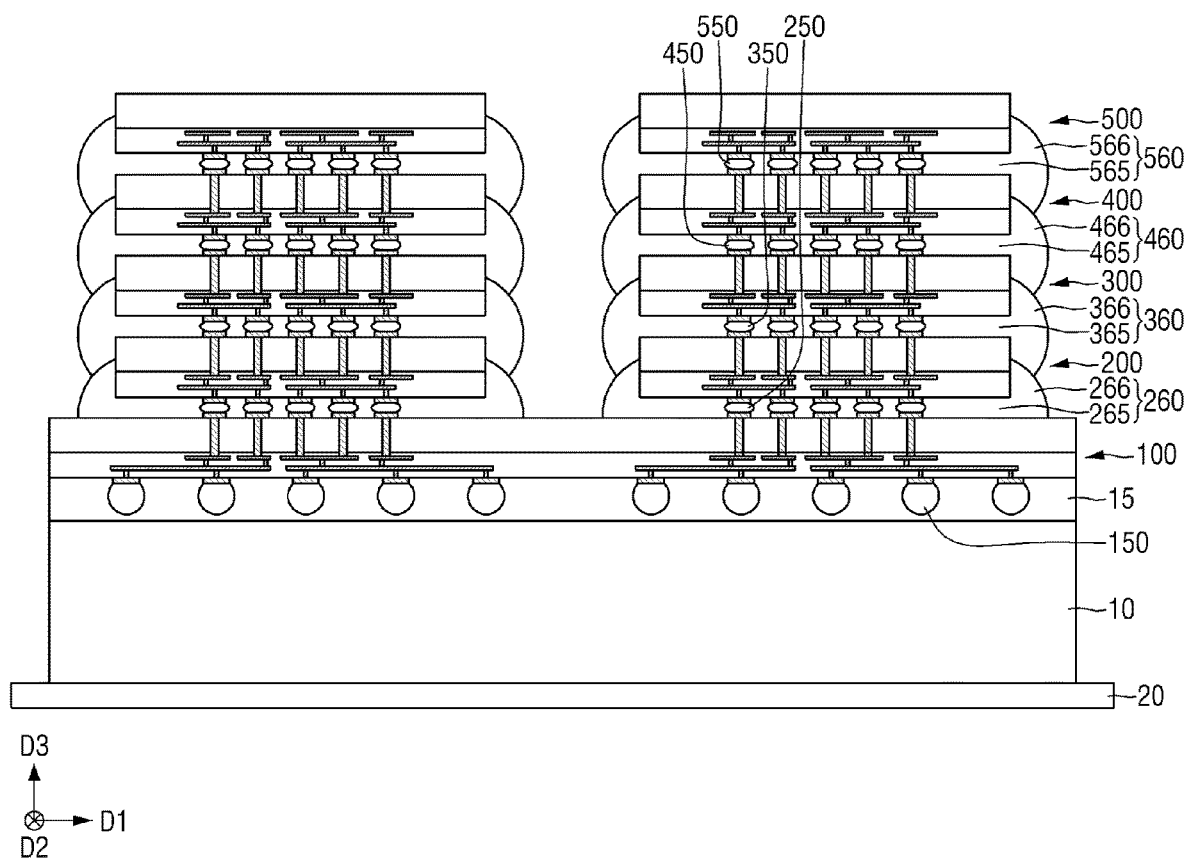

Referring to FIG. 13, a tape 20 may be attached onto the carrier substrate 10.

Figure 14:
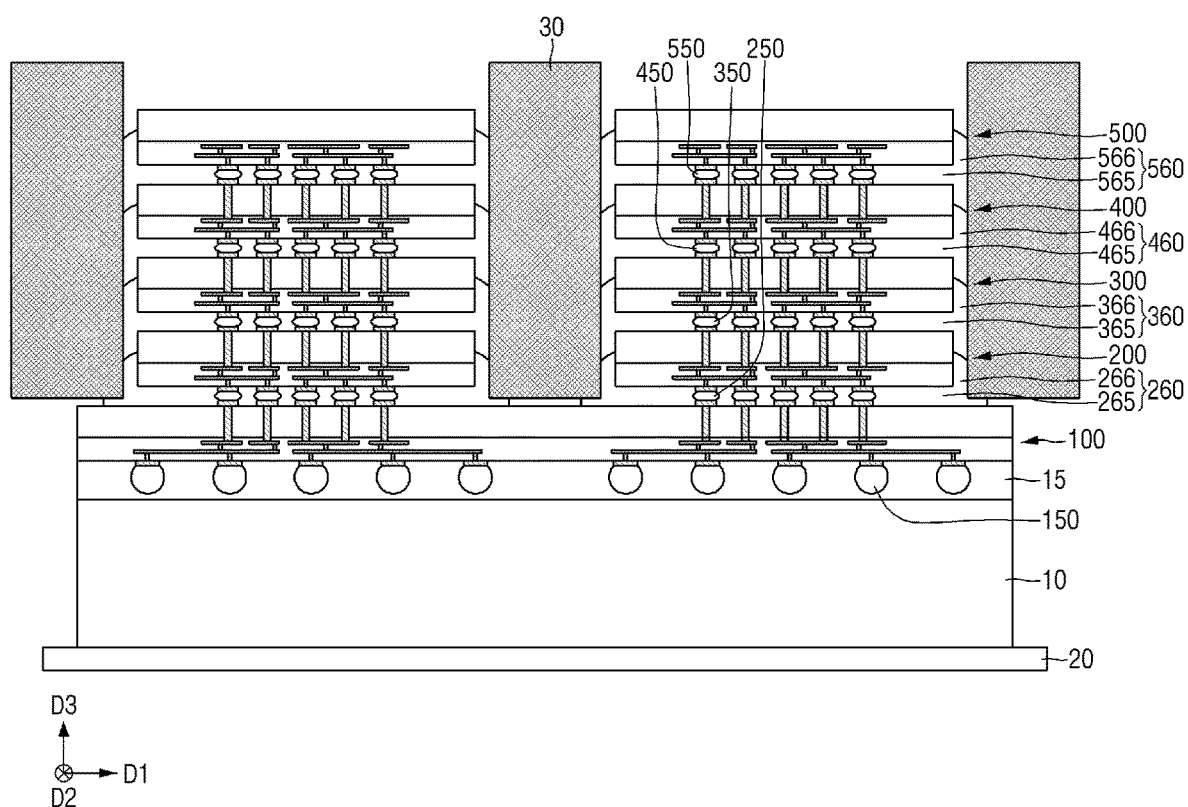

Referring to FIG. 14, the first to fourth inter-chip molding materials 260, 360, 460 and 560 may be cut. For example, the first to fourth inter-chip molding materials 260, 360, 460 and 560 may be cut by a blade 30. The blade 30 may cut the first to fourth inter-chip molding materials 260, 360, 460 and 560 to a position separated from the upper surface 100a of the first semiconductor chip 100 to prevent damage to the first semiconductor chip 100.

Figure 15:
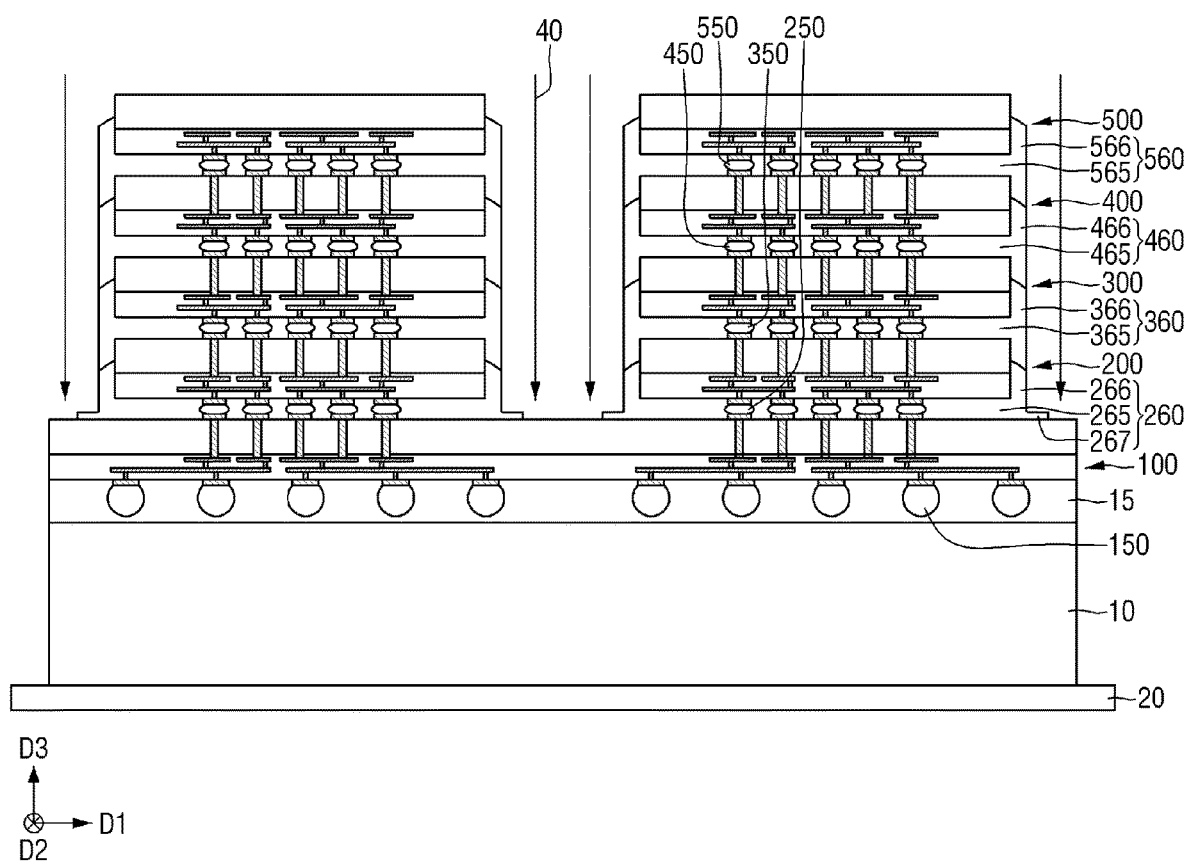

Referring to FIG. 15, the first to fourth inter-chip moldings 260, 360, 460 and 560 thus cut by the blade 30 may include flat portions and may be placed on the same plane. Further, a first protruding portion 267 may be formed.

The first to fourth inter-chip molding materials 260, 360, 460 and 560 that may remain on the upper surface 100a of the first semiconductor chip 100 adjacent to the first protruding portion 267 may be removed. For example, the first to fourth inter-chip molding materials 260, 360, 460 and 560 that may remain on the upper surface 100a of the first semiconductor chip 100 may be removed by a laser 40. A portion of the first protruding portion 267 may also be removed by the laser 40. Further, irregularities due to the laser 40 may be formed on the upper surface 100a of the first semiconductor chip 100.

Figure 16:
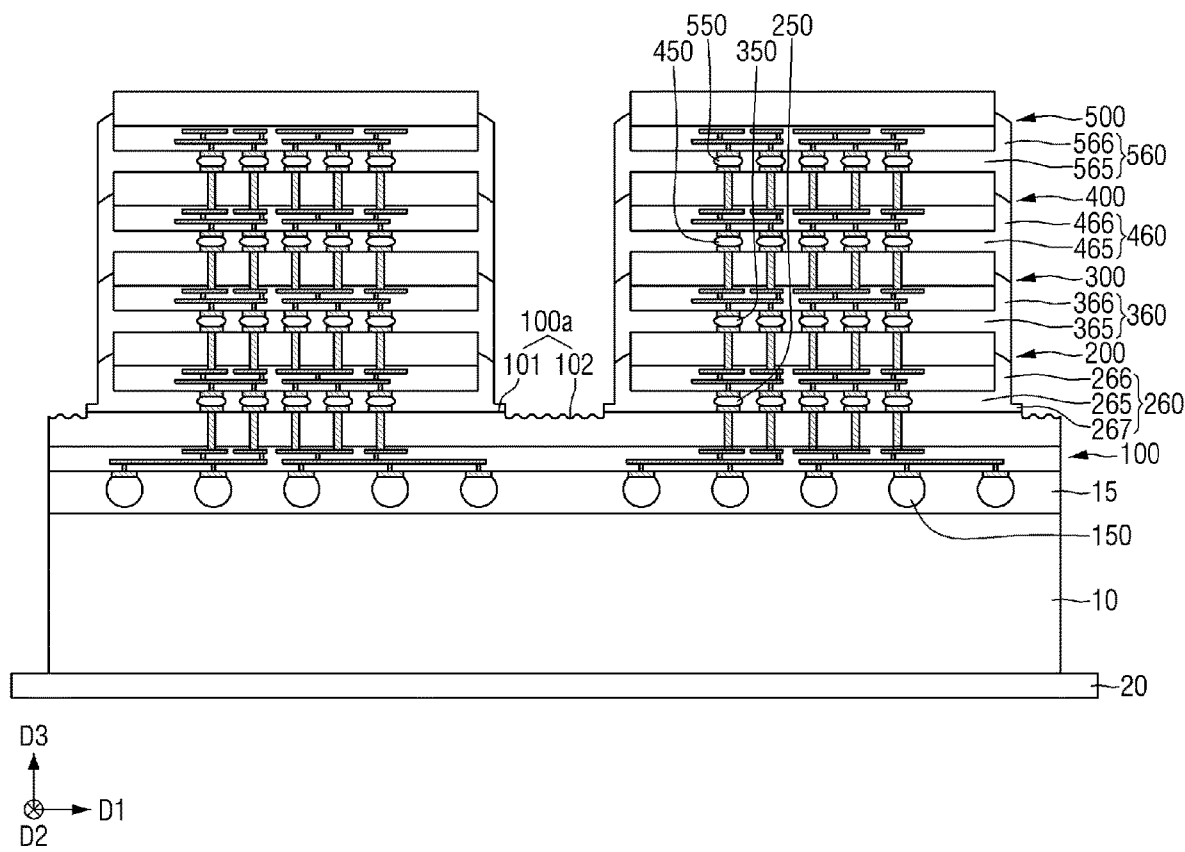

Referring to FIG. 16, the flat first region 101 and the second region 102 including irregularities may be formed on the upper surface 100a of the first semiconductor chip 100 accordingly.

Subsequently, referring to FIG. 2, the tape 20 is removed, and the package molding material 680 that covers the side walls of the second to fifth semiconductor chips 200, 300, 400 and 500 may be formed on the first semiconductor chip 100.

Subsequently, the carrier substrate 10 and the adhesive material layer 15 may be removed. Also, the first semiconductor chip 100 may be cut along a scribe lane. A semiconductor package in which the second to fifth semiconductor chips 200, 300, 400 and 500 are sequentially stacked on the first semiconductor chip 100 may be formed accordingly.

Although FIGS. 14 and 15 show that the first to fourth inter-chip molding materials 260, 360, 460 and 560 are removed by the blade 30 and laser 40, the present disclosure is not limited thereto. The first to fourth inter-chip molding materials 260, 360, 460 and 560 may be removed by either the blade 30 or the laser 40.

Figure 17:
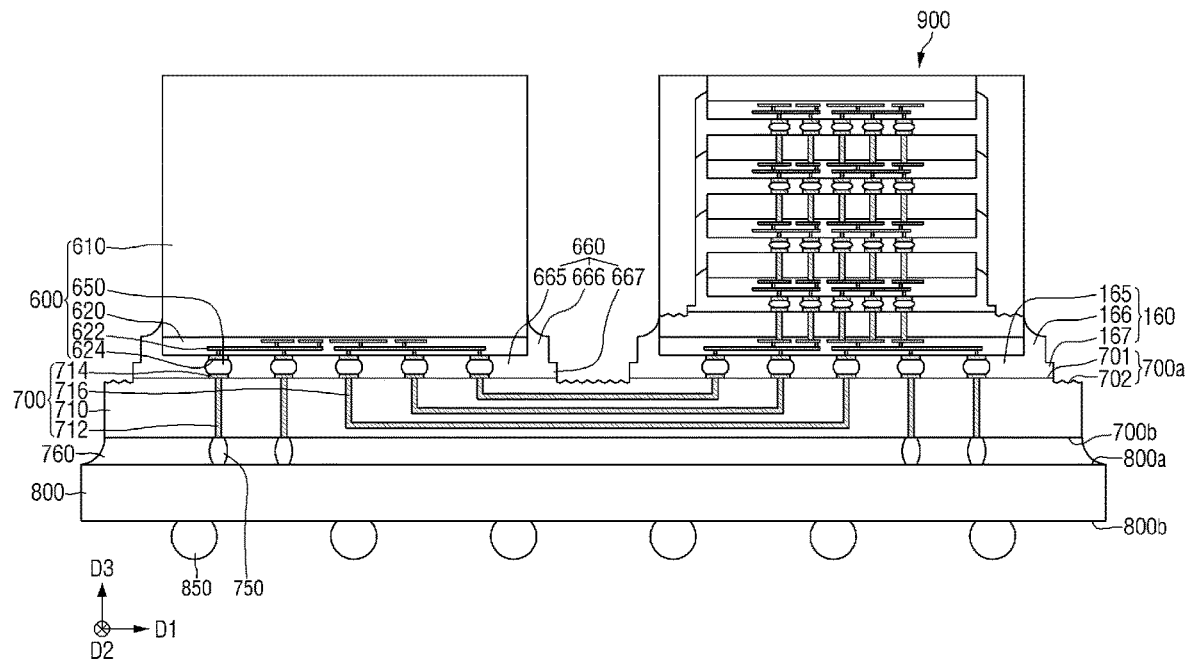
FIG. 17 is a diagram illustrating a semiconductor package according to an example embodiment of the inventive concepts.

FIG. 17 is a diagram for explaining a semiconductor package according to some embodiments. For convenience of explanation, the points different from those described using FIGS. 1 to 11 will be mainly described.

Referring to FIG. 17, the semiconductor package according to some embodiments may include a sixth semiconductor chip 600, an interposer substrate 700, a mounting substrate 800, and a stacked chip structure 900.

The stacked chip structure 900 may correspond to any one of the semiconductor packages shown in FIGS. 1 to 11.

The sixth semiconductor chip 600 may be, for example, a process unit. The sixth semiconductor chip 600 may be, but is not limited to, for example, an MPU (Micro Processor Unit) or a GPU (Graphic Processor Unit).

The sixth semiconductor chip 600 may include a sixth chip substrate 610, a sixth semiconductor element layer 620, a sixth wiring layer 622, and a sixth lower connecting pad 624.

The sixth semiconductor element layer 620 may be placed on the lower surface of the sixth chip substrate 610. The sixth semiconductor element layer 620 may include a sixth wiring layer 622. The sixth wiring layer 622 may include a plurality of conductive wirings or conductive plugs.

The sixth lower connecting pad 624 may be placed on the lower surface of the sixth semiconductor chip. The sixth lower connecting pad 624 may be placed on the lower surface of the sixth semiconductor element layer 620. The sixth lower connecting pad 624 may be electrically connected to the sixth wiring layer 622.

An interposer substrate 700 may include a seventh chip substrate 710, a seventh through via 712, a seventh upper connecting pad 714, and an inter-chip connection wiring 716.

The seventh through via 712 and the inter-chip connection wiring 716 may be placed inside the seventh chip substrate 710. The seventh through via 712 may penetrate the seventh chip substrate 710. Although FIG. 17 shows that the seventh through via 712 is formed to penetrate the seventh chip substrate 710, this is only for convenience of explanation, and the embodiment is not limited thereto.

The seventh upper connecting pad 714 may be placed on the upper surface of the seventh chip substrate 710. The seventh upper connecting pad 714 may be electrically connected to the seventh through via 712 and the inter-chip connection wiring 716.

The interposer substrate 700 may include an upper surface 700a and a lower surface 700b that are opposite to each other. A stacked chip structure 900 and a sixth semiconductor chip 600 may be placed on the upper surface 700a of the interposer substrate. A mounting substrate 800 may be placed on the lower surface 700b of the interposer substrate.

The stacked chip structure 900 and the sixth semiconductor chip 600 may be electrically connected to the interposer substrate 700. The stacked chip structure 900 and the sixth semiconductor chip 600 may be electrically connected to the seventh upper connecting pad 714.

The first connecting terminal 150 may be placed between the interposer substrate 700 and the stacked chip structure 900. The first connecting terminal 150 may electrically connect the interposer substrate 700 and the stacked chip structure 900.

The sixth connecting terminal 650 may be placed between the sixth semiconductor chip 600 and the interposer substrate 700. The sixth connecting terminal 650 may electrically connect the interposer substrate 700 and the sixth semiconductor chip 600.

A fifth inter-chip molding material 160 may be placed between the stacked chip structure 900 and the interposer substrate 700. The fifth inter-chip molding material 160 may include a fifth filling portion 165, a fifth extension portion 166, and a fifth protruding portion 167.

The fifth filling portion 165 may fill between the stacked chip structure 900 and the interposer substrate 700, such that, in the third direction D3, the stacked chip structure 900 overlaps the fifth filling portion 165, and the fifth filling portion 165 overlaps the interposer substrate 700. For example, the stacked chip structure 900 may vertically overlap the fifth filling portion 165, and the fifth filling portion 165 may vertically overlap the interposer substrate 700. The fifth filling portion 165 may enclose the first connecting terminal 150.

The fifth extension portion 166 may be placed on the upper surface 700a of the interposer substrate. The fifth extension portion 166 may extend along at least a part of the side surface of the stacked chip structure 900. The fifth extension portion 166 may extend in the third direction D3. The side wall of the fifth extension portion 166 may be flat.

The fifth protruding portion 167 may not be placed between the stacked chip structure 900 and the interposer substrate 700, such that, in the third direction D3, the stacked chip structure 900 does not overlap the fifth protruding portion 167. For example, the stacked chip structure 900 may not vertically overlap the fifth protruding portion 167. The fifth protruding portion 167 may overlap, in the third direction D3, the interposer substrate 700. For example, the fifth protruding portion 167 may vertically overlap the interposer substrate 700. The fifth protruding portion 167 may protrude from the fifth extension portion 166. The fifth protruding portion 167 may protrude from the fifth extension portion 166 toward the stacked chip structure 900.

The fifth protruding portion 167 may be placed on the upper surface 700a of the interposer substrate. The fifth protruding portion 167 may be in contact with the upper surface 700a of the interposer substrate. The fifth protruding portion 167 may extend along the upper surface 700a of the interposer substrate.

A sixth inter-chip molding material 660 may be placed between the sixth semiconductor chip 600 and the interposer substrate 700. The sixth inter-chip molding material 660 may include a sixth filling portion 665, a sixth extension portion 666, and a sixth protruding portion 667.

The sixth filling portion 665 may fill between the sixth semiconductor chip 600 and the interposer substrate 700, such that, in the third direction D3, the sixth semiconductor chip 600 overlaps the sixth filling portion 665, and the sixth filling portion 665 overlaps the interposer substrate 700. For example, the sixth semiconductor chip 600 may vertically overlap the sixth filling portion 665, and the sixth filling portion 665 may vertically overlap the interposer substrate 700. The sixth filling portion 665 may enclose the sixth connecting terminal 650.

The sixth extension portion 666 may be placed on the upper surface 700a of the interposer substrate. The sixth extension portion 666 may extend along at least a part of the side surface of the sixth semiconductor chip 600. The sixth extension portion 666 may extend in the third direction D3. The side wall of the sixth extension portion 666 may be flat.

The sixth protruding portion 667 may not be placed between the sixth semiconductor chip 600 and the interposer substrate 700, such that, in the third direction D3, the sixth semiconductor chip 600 does not overlap the sixth protruding portion 667. For example, the sixth semiconductor chip 600 may not vertically overlap the sixth protruding portion 667. The sixth protruding portion 667 may overlap, in the third direction D3, the interposer substrate 700. For example, the sixth protruding portion 667 may vertically overlap the interposer substrate 700. The sixth protruding portion 667 may protrude from the sixth extension portion 666. The sixth protruding portion 667 may protrude from the sixth extension portion 666 toward the stacked chip structure 900.

The sixth protruding portion 667 may be placed on the upper surface 700a of the interposer substrate. The sixth protruding portion 667 may be in contact with the upper surface 700a of the interposer substrate. The sixth protruding portion 667 may extend along the upper surface 700a of the interposer substrate.

At least a part of the upper surface 700a of the interposer substrate between the sixth semiconductor chip 600 and the stacked chip structure 900, in the first direction D1 (e.g., a horizontal direction), may include irregularities. For example, the upper surface 700a of the interposer substrate may include a flat third region 701, and a fourth region 702 including irregularities. The third region 701 may be in contact with the fifth inter-chip molding material 160 and the sixth inter-chip molding material 660, and the fourth region 702 may not be in contact with the fifth inter-chip molding material 160 and the sixth inter-chip molding material 660. The fourth region 702 may be placed below the third region 701 with respect to the third direction D3.

The fifth inter-chip molding material 160 and the sixth inter-chip molding material 660 may include an underfill material. The underfill material may be, for example, an insulating polymer or epoxy resin.

The mounting substrate 800 may be a packaging substrate, and may be, for example, a printed circuit board (PCB) or a ceramic substrate. The mounting substrate 800 may include an upper surface 800a and a lower surface 800b that are opposite to each other.

A first external connecting terminal 850 may be placed on the lower surface 800b of the mounting substrate. The first external connecting terminal 850 may electrically connect the semiconductor package to the external device. The first external connecting terminal 850 may provide an electrical signal to the stacked chip structure 900 and the sixth semiconductor chip 600, or may provide the electrical signal to an external device from the stacked chip structure 900 and the sixth semiconductor chip 600.

The interposer substrate 700 may be placed on the upper surface 800a of the mounting substrate. The interposer substrate 700 may be electrically connected to the mounting substrate 800.

A second external connecting terminal 750 may be placed between, with respect to the third direction D3, the interposer substrate 700 and the mounting substrate 800. The second external connecting terminal 750 may electrically connect the interposer substrate 700 to the mounting substrate 800.

A seventh inter-chip molding material 760 may be placed between, with respect to the third direction D3, the interposer substrate 700 and the mounting substrate 800. The seventh inter-chip molding material 760 may enclose the second external connecting terminal 750.

Figure 18:
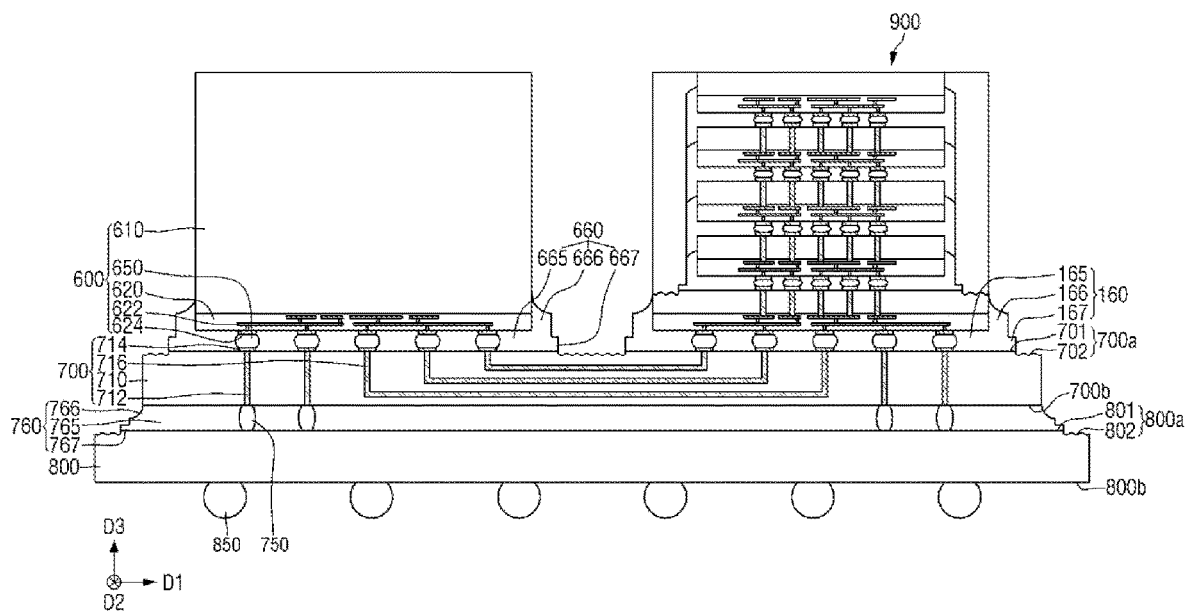
FIG. 18 is a diagram illustrating the semiconductor package according to an example embodiment of the inventive concepts.

FIG. 18 is a diagram for explaining a semiconductor package according to some embodiments. For convenience of explanation, the points different from those described using FIG. 17 will be mainly described.

Referring to FIG. 18, in the semiconductor package according to some embodiments, the seventh inter-chip molding material 760 may include a seventh filling portion 765, a seventh extension portion 766, and a seventh protruding portion 767.

The seventh filling portion 765 may fill between the interposer substrate 700 and the mounting substrate 800, such that, in the third direction D3, the interposer substrate 700 overlaps the seventh filling portion 765, and the seventh filling portion 765 overlaps the third mounting substrate 800. For example, the interposer substrate 700 may vertically overlap the seventh filling portion 765, and the seventh filling portion 765 may vertically overlap the third mounting substrate 800. The seventh filling portion 765 may enclose the second external connecting terminal 750.

The seventh extension portion 766 may be placed on the upper surface 800a of the mounting substrate. The seventh extension portion 766 may extend along at least a part of the side surface of the interposer substrate 700. The seventh extension portion 766 may extend in the third direction D3. The side wall of the seventh extension portion 766 may be flat.

The seventh protruding portion 767 may not be placed between the interposer substrate 700 and the mounting substrate 800. For example, the interposer substrate 700 may not vertically overlap the seventh protruding portion 767. The seventh protruding portion 767 may protrude from the seventh extension portion 766. The seventh protruding portion 767 may protrude from the seventh extension portion 766 toward the side wall of the mounting substrate 800.

The seventh protruding portion 767 may be placed on the upper surface 800a of the mounting substrate. The seventh protruding portion 767 may be in contact with the upper surface 800a of the mounting substrate. The seventh protruding portion 767 may extend along the upper surface 800a of the interposer mounting substrate.

At least a part of the upper surface 800a of the mounting substrate may include irregularities. For example, the upper surface 800a of the mounting substrate may include a flat fifth region 801, and a sixth region 802 including irregularities. The fifth region 801 may be in contact with the seventh inter-chip molding material 760, and the sixth region 802 may not be in contact with the seventh inter-chip molding material 760. The sixth region 802 may be placed below the fifth region 801.

The seventh inter-chip molding material 760 may include an underfill material. The underfill material may be, for example, an insulating polymer or epoxy resin.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor package comprising:
a first semiconductor chip which includes a first chip substrate and a first through via penetrating the first chip substrate;
a second semiconductor chip disposed on the first semiconductor chip, the second semiconductor chip includes a second chip substrate and a second through via penetrating the second chip substrate;

a connecting terminal disposed between the first semiconductor chip and the second semiconductor chip to electrically connect the first through via and the second through via; and an inter-chip molding material which includes a filling portion that fills between the first semiconductor chip and the second semiconductor chip and encloses the connecting terminal, an extension portion that extends in a first direction along at least a part of a side surface of the second semiconductor chip, and a protruding portion protruding from the extension portion in a second direction that is perpendicular to the first direction.

2. The semiconductor package of claim 1, wherein the protruding portion is not disposed between the first semiconductor chip and the second semiconductor chip.

3. The semiconductor package of claim 1, wherein the protruding portion is in contact with an upper surface of the first semiconductor chip.

4. The semiconductor package of claim 1, wherein a side wall of the extension portion includes a flat portion.

5. The semiconductor package of claim 1, wherein a side wall of the extension portion includes a tapered portion.

6. The semiconductor package of claim 1, wherein a side wall of the extension portion includes a portion which is indented toward the filling portion.

7. The semiconductor package of claim 1, wherein an upper surface of the protruding portion connected to the extension portion is concave toward the first semiconductor chip.

8. The semiconductor package of claim 1, wherein an upper surface of the protruding portion connected to the extension portion is convex toward the first semiconductor chip.

9. The semiconductor package of claim 1, wherein an upper surface of the first semiconductor chip includes a flat first region and a second region including irregularities.

10. The semiconductor package of claim 9, wherein the second region is disposed below the first region in a direction perpendicular to the upper surface of the first semiconductor chip.

11. The semiconductor package of claim 9, wherein the flat first region is in contact with the inter-chip molding material.

12. The semiconductor package of claim 1, further comprising:

a package molding material which covers an upper surface of the first semiconductor chip, a side surface of the second semiconductor chip, and the inter-chip molding material, on the first semiconductor chip.

13. The semiconductor package of claim 12, wherein the upper surface of the first semiconductor chip being in contact with the package molding material includes irregularities, and the upper surface of the first semiconductor chip being in contact with the inter-chip molding material is flat.

* * * * *